United States Patent
Lee

(10) Patent No.: US 7,038,262 B2
(45) Date of Patent: May 2, 2006

(54) INTEGRATED CIRCUIT DEVICES INCLUDING AN INTAGLIO PATTERN

(75) Inventor: Moon-Sook Lee, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/790,572

(22) Filed: Mar. 1, 2004

(65) Prior Publication Data
US 2004/0191929 A1 Sep. 30, 2004

(30) Foreign Application Priority Data
Mar. 3, 2003 (KR) .................... 10-2003-0013120

(51) Int. Cl.
*H01L 29/94* (2006.01)
(52) U.S. Cl. .................. 257/295; 257/306; 257/310; 257/311
(58) Field of Classification Search ........ 257/E27.016, 257/E27.033, E27.084, 295, E27.086, E27.088, 257/306, 309–311; 438/253, 256, 396, 399
See application file for complete search history.

(56) References Cited

U.S. PATENT DOCUMENTS

| | | | | |
|---|---|---|---|---|
| 5,061,650 A | * | 10/1991 | Dennison et al. | 438/253 |
| 5,279,983 A | * | 1/1994 | Ahn | 438/396 |
| 5,383,088 A | * | 1/1995 | Chapple-Sokol et al. | 361/305 |
| 5,770,499 A | * | 6/1998 | Kwok et al. | 438/253 |
| 6,077,738 A | * | 6/2000 | Lee et al. | 438/241 |
| 6,204,114 B1 | * | 3/2001 | Clampitt et al. | 438/253 |
| 6,215,646 B1 | * | 4/2001 | Ochiai et al. | 361/301.4 |
| 6,238,963 B1 | | 5/2001 | Chen et al. | |
| 6,255,160 B1 | * | 7/2001 | Huang | 438/253 |
| 6,268,260 B1 | | 7/2001 | Keil | |
| 6,294,426 B1 | * | 9/2001 | Tu et al. | 438/255 |
| 6,861,690 B1 | * | 3/2005 | Park | 257/296 |
| 2003/0139006 A1 | * | 7/2003 | Walter et al. | 438/240 |
| 2005/0023588 A1 | * | 2/2005 | Sandhu et al. | 257/309 |

OTHER PUBLICATIONS

Maozzami, R. et al., "Integration of Ferroelectric Capacitor Technology with CMOS", 1994 Symposium on VLSI Technology Digest of Technical Papers, IEEE, 1994, pp. 55-56, no month cited.

Tatsumi Sumi et al., "FA 16.2: A 256kb Nonvolatile Ferroelectric Memory at 3V and 100ns", 1994 IEEE International Solid State Circuits Conference, pp. 268-269, Feb. 1994.

* cited by examiner

*Primary Examiner*—Allan R. Wilson
(74) *Attorney, Agent, or Firm*—Myers Bigel Sibley & Sajovec

(57) ABSTRACT

Integrated circuit devices and methods of fabricating the same include an interlayer dielectric formed on an integrated circuit substrate. A plurality of buried contacts are formed in the interlayer dielectric and an oxide layer is formed on the interlayer dielectric. An intaglio pattern is formed in the oxide layer that exposes the plurality of buried contacts and a plurality of lower electrodes are formed within a single opening in the intaglio pattern. The lower electrodes are in electrical contact with corresponding ones of the buried contacts. The lower electrodes may be formed symmetrically in the intaglio pattern and may be semi-cylindrical electrodes. The integrated circuit device may be a ferroelectric memory device and forming a plurality of lower electrodes may include forming a plurality of capacitors.

11 Claims, 16 Drawing Sheets

US 7,038,262 B2

INTEGRATED CIRCUIT DEVICES INCLUDING AN INTAGLIO PATTERN

CLAIM OF PRIORITY

This application claims priority from Korean Patent Application No. 2003-13120, filed on Mar. 3, 2003, in the Korean Intellectual Property Office, the disclosure of which is hereby incorporated herein by reference.

BACKGROUND OF THE INVENTION

The present invention relates to memory devices and methods of fabricating the same, more specifically, to ferroelectric memory devices and methods of fabricating the same.

When an external voltage is applied to electric dipoles arranged in a ferroelectric material, the electric dipoles may be selectively polarized. Application of a reverse external field causes polarization in an opposite direction. The ferroelectric material generally has a hysteresis depending on a magnitude and direction of the applied electric field from the external voltage. An integrated circuit memory device writing and reading information using this property of a ferroelectric material is referred to ferroelectric memory device. A ferroelectric memory device may be used as a non-volatile memory device in which stored data can be retained even when power to the memory device is turn off. Such a ferroelectric memory device is further described, for example, in literature cited "Integration of Ferroelectric Capacitor Technology with CMOS" (Moazzami et al.), 1994 Symposium on VLSI Technology Digest of Technical Papers (Tatsumi Sumi et al.), pp. 55–56 and 1994 IEEE International Solid-State Circuits Conference, pp. 268.

A capacitor of a ferroelectric memory device may use noble metals (e.g., iridium, platinum and oxides thereof) as an upper and lower electrode. The capacitor may have a planar structure and a ferroelectric material thin film may be formed, for example, by sol-gel, sputtering and/or CVD methods or the like, on a planar lower electrode. As with other known types of integrated circuit (semiconductor) memory devices, as integration increases, cell dimensions of the ferroelectric memory device may become short and the corresponding dimensions of a cell capacitor also becomes shorter. In such highly integrated devices, a three dimensional capacitor (e.g., cylindrical-type or column type) may be formed to obtain a desired capacitance within the allotted space.

An example of a column-type capacitor structure is discussed in U.S. Pat. No. 6,268,260 assigned to Lam Research Incorporation. An example of a cylindrical-type capacitor structure is discussed in U.S. Pat. No. 6,238,963 assigned to IBM Incorporation. The described capacitors are proposed to address issues related to the disadvantages of a conventional plane capacitor due to limitations on the capacitor's assigned dimensions and to address a thin film of ferroelectric layer and limitations on the upper and lower electrodes.

FIG. 1 is cross-sectional illustration of a prior art ferroelectric memory device having a column-type capacitor. As shown in FIG. 1, the ferroelectric memory device includes a transistor(s) 3 a bit line 13 and column-type capacitor(s) 25. The transistor, including a gate electrode, is formed on an integrated circuit (semiconductor) substrate 1 between isolation layers 2. The bit line 13 is electrically connected to a source region 5a of the transistor 3 and is formed on a first interlayer dielectric (ILD) 9. A column-type capacitor 25 is electrically connected to each drain 5b of the transistor 3 and is formed on a second interlayer dielectric 15.

Each capacitor 25 includes a lower electrode 19, which may be of noble metal group, a ferroelectric layer 21 and an upper electrode 23. The ferroelectric layer 21 is interposed between the lower electrode 19 and the upper electrode 23. The bit line 13 may be electrically connected to the source 5a via a direct contact 11 interposed therebetween and the lower electrode 19 of each capacitor 25 may be electrically connected to a drain 5b via a buried contact 17 interposed therebetween. Alternatively, a direct contact 11 may be electrically connected to the source 5a via a first contact pad 7a interposed therebetween, and the buried contact 17 may be electrically connected to the drain 5b via a second contact pad 7b interposed therebetween.

Fabricating the capacitor 25 may include the steps of depositing and patterning noble materials to form the lower electrode 19 and depositing the ferroelectric on the lower electrode 19 and the second interlayer dielectric 15 to form the ferroelectric layer 21. Advantages of such a method may include reduction or prevention of degradation of the ferroelectric characteristic as the ferroelectric material may not be etched in forming the ferroelectric layer 21. In addition, the capacitance may be increased by increasing the size of the lower electrode 19. Disadvantages may arise in fabricating the ferroelectric memory device of FIG. 1. Two steps are generally required to form the lower electrode 19 of the capacitor 25. First, noble-metal group materials are relatively thickly deposited. Subsequently, an etching process is used for patterning the noble-metal group materials to form the lower electrode. As a result, the manufacturing costs may be increased because of the relatively thick deposition of the noble-metal group materials. Furthermore, it may be difficult for thickly deposited noble-metal group materials to be patterned to fabricate the lower electrode.

FIG. 2 is cross-sectional view illustrating a prior art ferroelectric memory device equipped with a cylindrical-type capacitor. As shown in FIG. 2, such a ferroelectric memory device includes a capacitor 25' equipped with a cylindrical structure that is formed on a third interlayer dielectric 18'. The structure in FIG. 2 is otherwise substantially the same as that illustrated in FIG. 1 and such common aspects will not be further described with reference to FIG. 2. For the cylindrical capacitor 25', surface dimensions of the electrodes may be further extended, which may further increase the capacitance.

As shown in FIG. 2, holes 20' may be formed by removing a part of the third interlayer dielectric 18' before forming the lower electrode 19' of a cylindrical capacitor. If the aspect ratio of the holes 20' rises, it may be difficult for the cylindrical capacitor 25' to be formed depending on a step coverage characteristic of the lower electrode 19'. To form a cylindrical capacitor 25' in narrow holes 20', there may be a need to form a thin film of the lower electrode 19', the ferroelectric 21' and the upper electrode 23' in respective process steps. In addition, the upper electrode 23 (or 23') may be misaligned with respect to the lower electrode 19 (or 19').

SUMMARY OF THE INVENTION

Embodiments of the present invention include methods of fabricating an integrated circuit device. An interlayer dielectric is formed on an integrated circuit substrate. A plurality of buried contacts are formed in the interlayer dielectric and an oxide layer is formed on the interlayer dielectric. An intaglio pattern is formed in the oxide layer that exposes the plurality of buried contacts and a plurality of lower electrodes are formed within a single opening in the intaglio pattern. The lower electrodes are in electrical contact with corresponding ones of the buried contacts. The lower electrodes may be formed symmetrically in the intaglio pattern and may be semi-cylindrical electrodes. The integrated circuit device may be a ferroelectric memory device and forming a plurality of lower electrodes may include forming a plurality of ferroelectric capacitors.

In further embodiments of the present invention, forming a plurality of capacitors includes forming a lower electrode metal layer in the intaglio pattern, forming a ferroelectric layer on the lower electrode metal layer, forming an upper electrode metal layer on the ferroelectric layer and then patterning the formed lower electrode metal layer, ferroelectric layer and upper electrode metal layer to form the plurality of capacitors. In alternative embodiments, forming a plurality of capacitors includes forming a lower electrode metal layer in the intaglio pattern, patterning the lower electrode metal layer to form the plurality of lower electrodes, forming a ferroelectric layer on the plurality of lower electrodes and forming upper electrodes on the ferroelectric layer.

In other embodiments of the present invention, forming an interlayer dielectric may be preceded by forming transistors on the integrated circuit substrate. Forming a plurality of buried contacts may include forming buried contacts electrically connected to respective ones of the transistors. Forming an intaglio pattern may include removing a portion of the oxide layer to expose a portion of the interlayer dielectric and upper surfaces of the buried contacts.

In further embodiments of the present invention, forming an intaglio pattern includes forming a multi-step intaglio pattern exposing upper surfaces of the buried contacts and part of an inner sidewall of the buried contacts. Forming a plurality of lower electrodes may include forming a plurality of multi-step lower electrodes contacting the exposed upper surface and inner sidewall of corresponding ones of the buried contacts. Forming a multi-step intaglio pattern or over-etching inside of intaglio pattern may include removing a portion of the oxide layer to expose the upper surfaces of the buried contacts and removing a portion of the interlayer dielectric between the buried contacts to expose the part of the inner sidewall of the buried contacts.

In other embodiments of the present invention, the integrated circuit device is a ferroelectric memory device and forming a plurality of lower electrodes includes forming a plurality of capacitors. Forming a plurality of capacitors includes forming a lower electrode metal layer in the intaglio pattern, forming a ferroelectric layer on the lower electrode metal layer, forming an upper electrode metal layer on the ferroelectric layer and then patterning the formed lower electrode metal layer, ferroelectric layer and upper electrode metal layer to form the plurality of capacitors. In alternative embodiments, forming a plurality of capacitors includes forming a lower electrode metal layer in the intaglio pattern, patterning the lower electrode metal layer to form the plurality of lower electrodes, forming a ferroelectric layer on the plurality of lower electrodes and forming upper electrodes on the ferroelectric layer.

In further embodiments of the present invention, forming an interlayer dielectric is preceded by forming transistors on the integrated circuit substrate and forming a plurality of buried contacts includes forming buried contacts electrically connected to respective ones of the transistors. Forming an interlayer dielectric and forming a plurality of buried contacts may include forming a first interlayer dielectric on the integrated circuit substrate including the transistors, forming a bit line direct contact in the first interlayer dielectric and electrically contacting the transistors, forming a bit line on the first interlayer dielectric and electrically contacting the bit line direct contact, forming a second interlayer dielectric on the first interlayer dielectric including the bit line and forming the buried contacts in the first and second interlayer dielectric and electrically contacting corresponding ones of the transistors. Forming a plurality of lower electrodes may include forming a plurality of semi-cylindrical electrodes symmetrically in the intaglio pattern.

In other embodiments of the present invention, integrated circuit devices include an integrated circuit substrate, an interlayer dielectric on the integrated circuit substrate having a plurality of buried contacts therein, an oxide layer on the interlayer dielectric, an intaglio pattern in the oxide layer over the buried contacts and a plurality of lower electrodes in the intaglio pattern that electrically contact corresponding ones of the buried contacts. The lower electrodes may be semi-cylindrical lower electrodes symmetrically arranged in the intaglio pattern.

In further embodiments of the present invention, the integrated circuit device is a ferroelectric memory device and the lower electrodes are lower electrodes of capacitors, the capacitors further including a ferroelectric layer on the lower electrodes and upper electrodes on the ferroelectric layers. The lower electrodes may include a horizontal electrode component contacting an upper surface of its corresponding buried contact and a vertical electrode component extending from the horizontal electrode component on a sidewall of the intaglio pattern. A plurality of transistors may be formed in the integrated circuit substrate and the buried contacts may electrically contact corresponding ones of the transistors.

In other embodiments of the present invention, the intaglio pattern is a two-step intaglio pattern extending along upper surfaces of the buried contacts and a part of inner sidewalls of the buried contacts. The lower electrodes may include a first vertical electrode component extending along the part of the inner sidewall of its corresponding buried contact, a horizontal electrode component extending from the first vertical electrode along the upper surface of its corresponding buried contact and a second vertical electrode component extending from the horizontal electrode component along a sidewall of the two-step intaglio pattern in the oxide layer. The lower electrodes may further include a second horizontal electrode component extending inwardly from the first vertical electrode component along a surface of the interlayer dielectric lower than a surface of the interlayer dielectric beyond the buried contacts. The capacitors may be semi-cylindrical capacitors symmetrically arranged in the intaglio pattern.

In further embodiments of the present invention, methods of fabricating a ferroelectric memory device including a semi-cylindrical capacitor include forming an oxide layer on an interlayer dielectric including a buried contact. An intaglio pattern is formed that exposes upper surfaces of at least two buried contacts and at least two lower electrodes are formed in contact with respective upper surfaces of the at least two buried contacts in the intaglio pattern. A ferroelectric layer and an upper electrode are formed on the at least two lower electrodes.

In other embodiments of the present invention, methods of fabricating a ferroelectric memory device including semi-cylindrical capacitors include forming an oxide layer on an interlayer dielectric including at least two buried contacts. An intaglio pattern is formed exposing the at least two buried contacts. A lower-electrode metal layer is formed contacting upper surfaces of the at least two buried contacts in the intaglio pattern. A ferroelectric material layer and an upper-electrode metal layer are formed sequentially in the intaglio pattern. The upper-electrode metal layer, the ferroelectric material layer and the lower-electrode metal layer are patterned to form the semi-cylindrical capacitors in the intaglio pattern, each of the capacitors having a lower electrode contacting a corresponding one of the at least two buried contacts.

In further embodiments of the present invention, methods of fabricating a ferroelectric memory device including semi-cylindrical capacitors include forming an oxide layer on an interlayer dielectric including at least two buried contacts and forming a two-step intaglio pattern exposing upper surfaces and a part of sidewalls of the at least two buried contacts. At least two lower electrodes are formed in contact with respective upper surfaces and sidewalls of the at least two buried contacts in the two-step intaglio pattern and a ferroelectric layer and an upper electrode are formed sequentially on the lower electrodes.

In other embodiments of the present invention, methods of a fabricating a ferroelectric memory device including semi-cylindrical capacitors include forming an oxide layer on an interlayer dielectric including at least two buried contacts and forming a multi-step, for example, two-step, intaglio pattern exposing the at least two buried contacts. A lower-electrode metal layer is formed contacting upper surfaces and sidewalls of the at least two buried contacts in the two-step intaglio pattern. A ferroelectric material layer and an upper-electrode metal layer are formed sequentially in the two-step intaglio pattern and on an upper surface of the oxide layer and the upper-electrode metal layer, the ferroelectric material layer and the lower-electrode metal layer are patterned to form the semi-cylindrical capacitors including a lower electrode, a ferroelectric and an upper electrode, each of capacitors having a lower electrode contacting a corresponding one of the at least two buried contacts.

In further embodiments of the present invention, ferroelectric memory devices including semi-cylindrical capacitors include an interlayer dielectric including at least two buried contacts and an oxide layer formed on the interlayer dielectric. An intaglio pattern exposes upper surfaces of the at least two buried contacts. At least two lower electrodes are formed in the intaglio pattern, each of the at least two lower electrodes being in contact with a corresponding one of the at least two buried contacts and a ferroelectric layer and an upper electrode are sequentially formed on the lower electrodes.

In other embodiments of the present invention, ferroelectric memory devices including semi-cylindrical capacitors include an interlayer dielectric including at least two buried contacts and an oxide layer formed on the interlayer dielectric. A two-step intaglio pattern exposes upper surfaces and a part of sidewalls of the at least two buried contacts. At least two lower electrodes are formed in the two-step intaglio pattern, each of the at least two lower electrodes being in contact with a corresponding one of the at least two buried contacts, and a ferroelectric layer and an upper electrode are sequentially formed on the lower electrodes.

BRIEF DESCRIPTION OF THE DRAWINGS

The above and other features and advantages of the present invention will become more apparent by describing embodiments thereof with reference to the attached drawings in which.

DETAILED DESCRIPTION OF THE INVENTION

Figure 1:
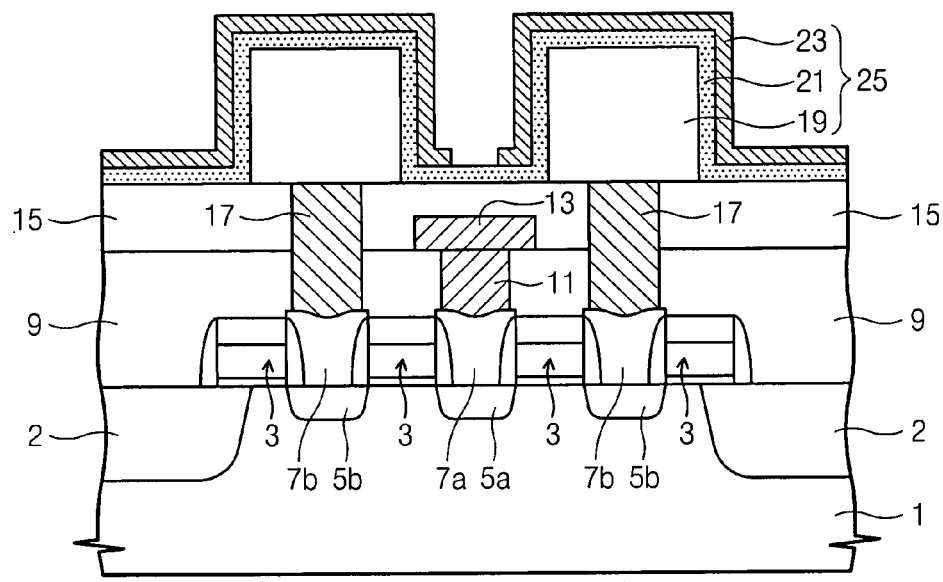
FIG. 1 is a cross-sectional view of a conventional ferroelectric memory device including a column-type capacitor.
Figure 2:
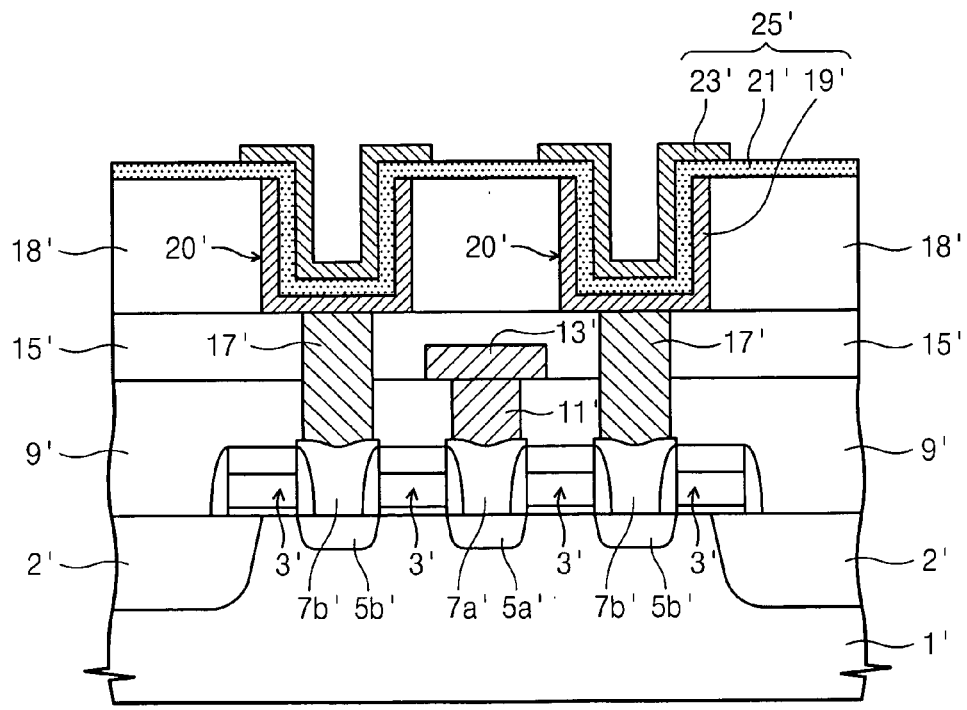
FIG. 2 is a cross-sectional view of a conventional ferroelectric memory device including a cylindrical-type capacitor.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element is referred to as being "attached", "connected", "on" or "coupled" to another element, it can be directly connected, on or coupled to the other element or intervening elements may be present. In contrast, when an element is referred to as being "directly attached," "directly connected," "directly on" or "directly coupled" to another element, there are no intervening elements present. Like numbers refer to like elements throughout the specification. As used herein the term "and/or" includes any and all combinations of one or more of the associated listed items.

Furthermore, relative terms, such as "lower" or "bottom" and "upper" or "top," may be used herein to describe one element's relationship to another elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure.

Figure 3:
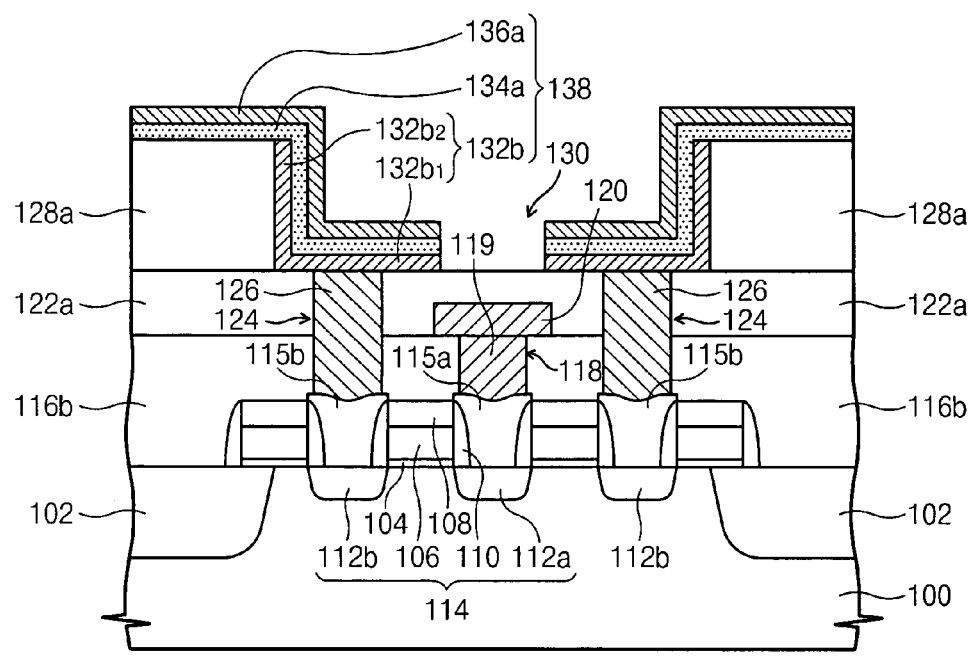
FIG. 3 is a cross-sectional view of a ferroelectric memory device equipped including a semi-cylindrical capacitor according to come embodiments of the present invention.

FIG. 3 is a cross-sectional view illustrating a ferroelectric memory device including a semi-cylindrical capacitor according to some embodiments of the present invention. FIG. 4 through FIG. 17 are cross-sectional views illustrating a method of forming the ferroelectric memory of FIG. 3 according to some embodiments of the present invention.

Figure 8:
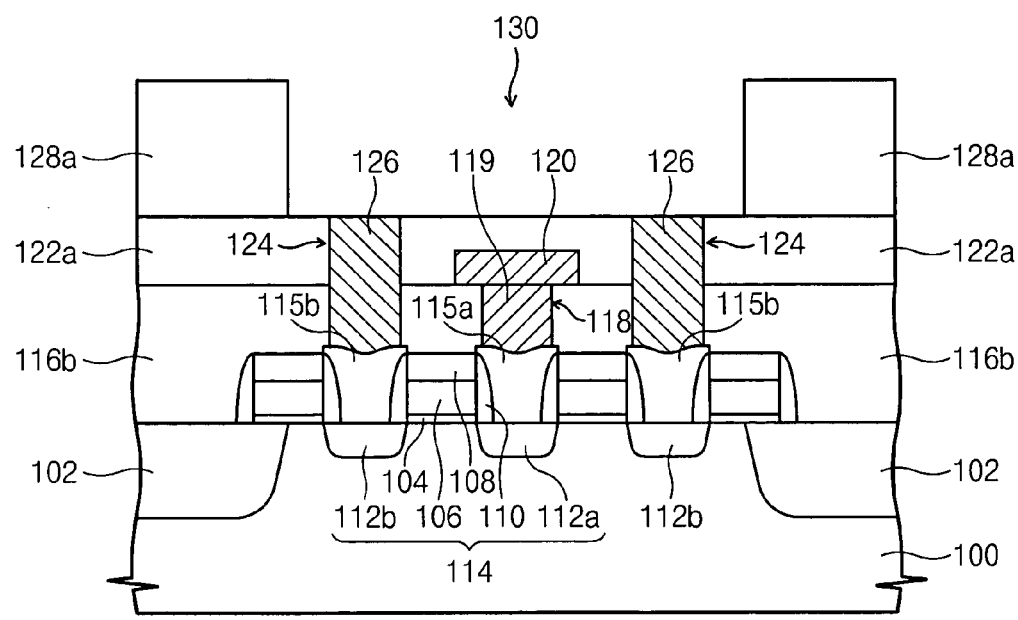

FIG. 8 is a cross-sectional view illustrating a ferroelectric memory device including a semi-cylindrical capacitor according to further embodiments of the present invention. FIG. 19 through FIG. 32 are cross-sectional views illustrating a method of forming the ferroelectric memory device of FIG. 8 according to some embodiments of the present invention.

As shown in the embodiments of FIG. 3, the ferroelectric memory device includes: an integrated circuit (semiconductor) substrate 100 including a transistor 114; an interlayer dielectric 116b (hereinafter referred to as "a first interlayer dielectric") formed on the semiconductor substrate 100; a bit line 120 electrically connected to the semiconductor substrate 100; an interlayer dielectric 122a (hereinafter referred to as "a second interlayer dielectric") including a buried contact 126; an oxide layer 128a formed on the second interlayer dielectric 122a; an intaglio pattern 130 exposing upper surfaces of at least two buried contacts 126 through the oxide layer 128a; at least two lower electrode 132b formed in an intaglio pattern 130 symmetrically; and a ferroelectric layer 134a and an upper electrode 136a on respective upper surfaces of the at least two lower electrodes 132b, which may be sequentially formed.

An active region may be defined n the semiconductor substrate 100 by an isolation layer 102. The transistor 114 is disposed on the active region. For purposes of simplification of the description herein, generally only the formation of the structure associated with one of the two illustrated drain regions 112b will be described. The transistor 114 illustrated in FIG. 3 includes a gate insulation layer 104, a gate electrode 106 and a hard mask 108. The gate insulation layer 104, the gate electrode 106 and the hard mask 108 may be stacked sequentially. Agate spacer 110 maybe formed on both sidewalls of the transistor 114. The transistor 114 is shown as having a source region 112a and a drain region 112b. The source region 112a may be formed by implanting a predetermined ion into the semiconductor substrate 100. It is to be understood that in various embodiments of the present invention, the transistor 114 may take different forms than that illustrated in FIG. 3.

The bit line 120 may be electrically connected to the source region 112a through a direct contact 119. The direct contact may be formed penetrating the first interlayer dielectric 116b. The direct contact 119 may be electrically connected to the source region 112a through a contact pad 115a formed on the source region 112a.

The lower electrode 132b is electrically connected to the drain 112b through the buried contact 126. The buried contact 126 may extend through the first dielectric layer 116b and the second interlayer dielectric 122a. The buried contact 126 may be electrically connected to the drain region 112b through a contact pad 115b formed on the drain region 112b.

As shown in the embodiments of FIG. 3, the capacitor 138 includes the lower electrode 132b, the ferroelectric layer 134a and the upper electrode 136a, which may be stacked sequentially. The lower electrode 132b and the upper electrode 136a may be formed of a material(s) from the noble-metal group, such as iridium and/or platinum. The ferroelectric layer 134a may be composed of ferroelectric material(s) such as PZT (Lead Zirconium Titrate), SBT (Strontium Barium Tantalum), SBTN (Strontium Barium Tantalum Nitride), SBTT (Strontium Barium Tantalum Titanate) or the like.

For the embodiments illustrated in FIG. 3, the lower electrode 132b is formed symmetrically in the intaglio pattern 130 in an oxide layer 128a. The lower electrode 132b shown in FIG. 3 includes a horizontal electrode component 132b, and a vertical electrode component $132b_2$. The horizontal electrode component 132b, is in contact with a respective upper surface of the buried contact 126 and the vertical electrode $132b_2$ is formed on a sidewall of the intaglio pattern 130 in the oxide layer 128a. The oxide layer 128a extends from the horizontal electrode component 132b, to define sidewalls of the intaglio pattern 130. Thus, the two respective lower electrodes 132b illustrated in FIG. 3 have an 'L-shaped' configuration and may further have a symmetric structure in the intaglio pattern 130 so that the two respective lower electrodes 132b face each other.

The ferroelectric layer 134a and the upper electrode 136a may be sequentially stacked on each lower electrode 132b to form at least two capacitors 138 symmetrically in the intaglio pattern 130. As a result, at least two semi-cylindrical capacitors may be formed symmetrically.

The surface dimensions of electrodes of the capacitors illustrated in FIG. 3 may be increased in comparison to a planar shaped capacitor because the capacitor 138 is formed as a semi-cylindrical capacitor. The capacitance of an integrated circuit capacitor is generally proportional to a surface area determined by dimensions of the electrodes. A semi-cylindrical capacitor may provide an increased surface dimension compared to a planar shape and, as a result, the capacitance may be increased for a given region size on an integrated circuit substrate.

Furthermore, the lower electrode 132b, the ferroelectric layer 134a and the upper electrode 136a for the embodiments illustrated in FIG. 3 are formed in the intaglio pattern 130 that may have a low aspect ratio. The intaglio pattern 130 may open at least two buried contact 126 through the oxide layer 128a.

Figure 4:
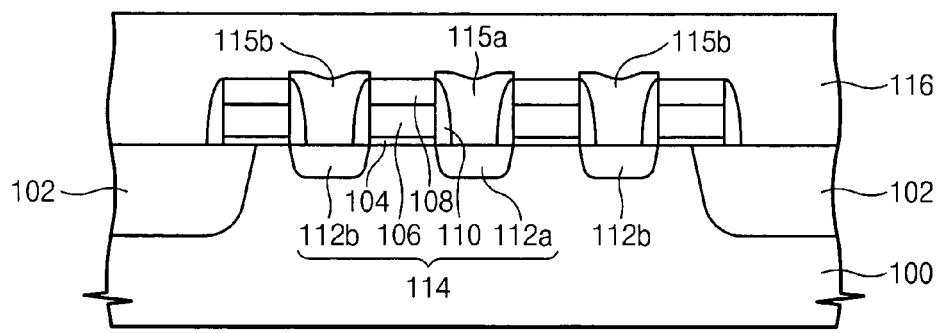
FIG. 4 to FIG. 17 are cross-sectional views illustrating a method of fabricating the ferroelectric memory device of FIG. 3 according to some embodiments of the present invention.

Methods of forming the ferroelectric memory device of FIG. 3 according to some embodiments of the present invention will now be described with reference to FIG. 4 through FIG. 13. As shown in FIG. 4, an integrated circuit (semiconductor) substrate 100, such as silicon, is provided. An active region is defined by forming an isolation layer 102, for example, using a trench formation method.

A transistor 114 associated with a word line may be formed on the active region of the semiconductor substrate 100 defined by the isolation layer 102. Forming the transistor 114 shown in FIG. 4 may include forming the gate insulation layer 104, the gate electrode 106, the hard mask 108 and the gate spacer 110, the source region 112a and the drain region 112b (as with FIG. 3, the description herein will focus on the structure associated with one of the drain regions 112b to simplify the description). The transistor 114 may also be formed of another element, such as LDD (Lightly Doped Drain) or double gate spacers. Furthermore, the transistor 114 may be embodied in a different structure than that illustrated in FIG. 4. For example, the hard mask 108 may not be formed. Contact pads 115a and 115b may also be formed on the semiconductor substrate 100.

An interlayer dielectric 116 (hereinafter referred to as "a first interlayer dielectric") is illustrated as continuously formed on the semiconductor substrate 100 in the region including the transistor 114. The first interlayer dielectric 116 may be formed to a desired thickness, for example, using a conventional CVD process. The transistor 114 may be completely covered by an insulation material, such as silicon oxide, to the desired thickness.

Figure 5:
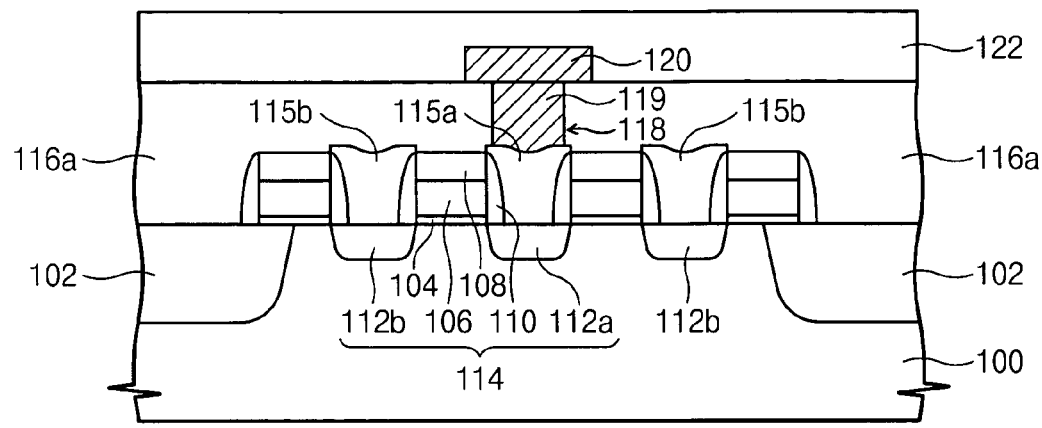

Referring now to FIG. 5, a part of the first interlayer dielectric 116 is shown as being removed to expose the contact pad 115a, for example, by anisotropic etching. More particularly, a first contact hole 118 is formed penetrating the first interlayer dielectric 116*a*. A direct contact 119 may be formed by forming conductive materials in the first contact hole 118.

As shown in FIG. 5, the bit line 120 is formed on the first interlayer dielectric 116*a*. The bit line 120 may be formed to contact the direct contact 119, for example, by depositing and patterning a conductive material. The bit line 120 may operate as a data line of the ferroelectric memory device.

Another interlayer dielectric 122 (hereinafter referred to as "a second interlayer dielectric") may be continuously formed on the first interlayer dielectric 116*a* including the bit line 120. As with the first interlayer dielectric 116, the second interlayer dielectric 122 may be formed to a desired thickness by, for example, a conventional CVD process to cover the bit line 120 completely with, for example, silicon oxide or the like.

Figure 6:
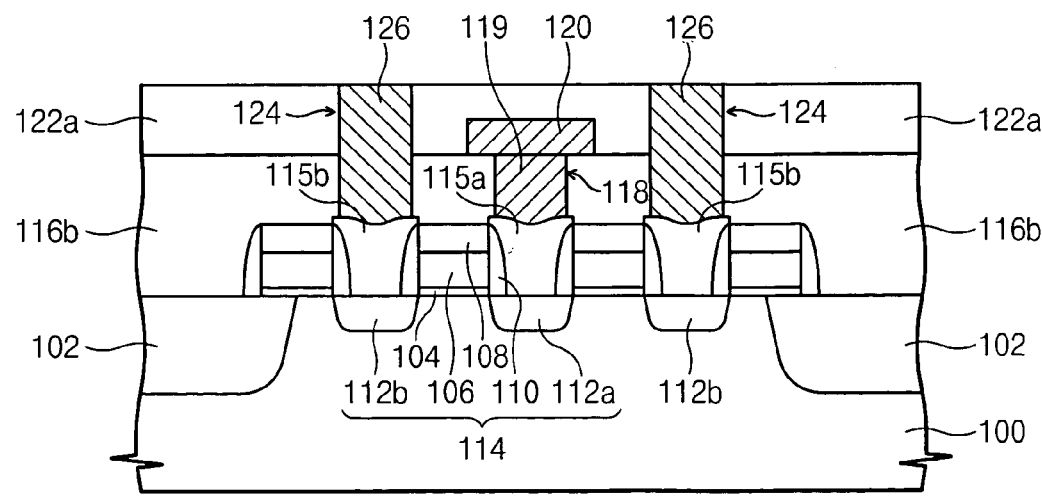

As shown in the embodiments of FIG. 6, portions of the first interlayer dielectric 116*a* and the second interlayer dielectric 122 are selectively removed to expose the contact pad 115*b*. The contact pad 115*b* may be formed on the drain 112*b* by performing, for example, anisotropic etching, such as plasma drying. As a result, a second contact hole 124 may be formed. The second contact hole 124 penetrates the first and the interlayer dielectrics 116*b* and 122*a*. The second interlayer dielectric 122*a* may be selectively removed and the second contact hole 124 may have metal conductive materials, such as poly silicon or tungsten, deposited therein to form a buried contact 126. The buried contact 126 is shown as electrically connected through the contact pad 115*b* to the drain region 112*b*.

Figure 7:
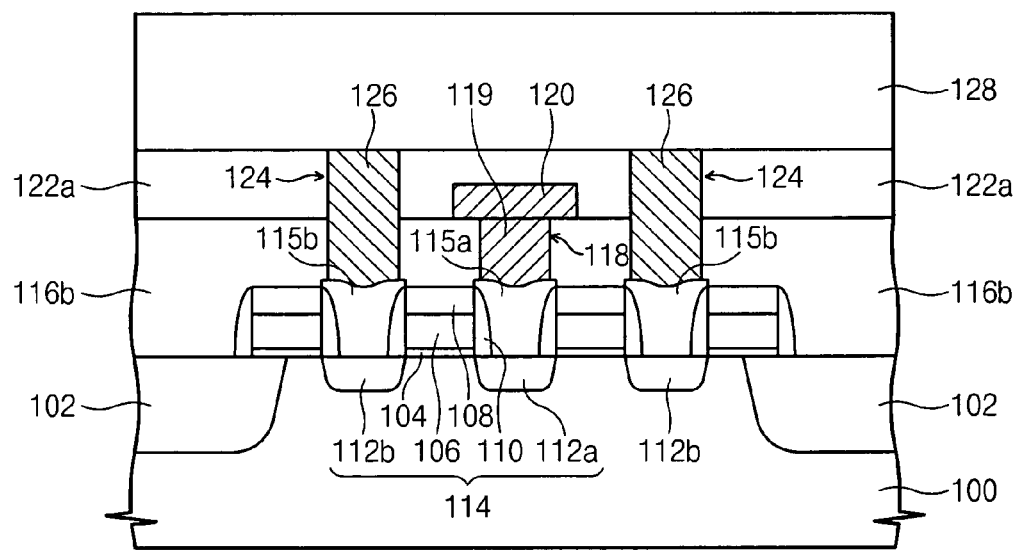

As shown in the embodiments of FIG. 7, the oxide layer 128*b* is formed the second interlayer dielectric 122*a* in the region including the buried contact 126. For example, the oxide layer 128 may be formed by depositing oxidation materials, such as silicon dioxide or the like, using a conventional CVD process.

As illustrated in FIG. 8, a part of oxide has been etched to expose an upper portion of the at least two buried contacts 126 and a part of the upper surfaces of the second interlayer dielectric 122*a* to define the intaglio pattern 130, which opens the upper surfaces of the at least two buried contacts 126. Thus, a bottom of the intaglio pattern 130 is defined by the upper surfaces of the interlayer dielectric 122*a* and at least two buried contacts 126 for the embodiments shown in FIG. 8. The sidewalls of the intaglio pattern 103 are shown as defined by the partially etched oxide layer 128*a*. From a plane perspective, it will be understood that the shape of the intaglio pattern 180 may be a flat disc and the intaglio pattern 130 may have low aspect ratio.

Two or more capacitors (see 130 in FIG. 13 or 138 in FIG. 17) in respective contact with corresponding buried contacts 126 are formed in the intaglio pattern 130. In addition, preceding and/or subsequent isolation processes may selectively be applied as will be further described. A preceding isolation process for some embodiments of the present invention is illustrated in FIG. 9 through FIG. 13. A subsequent isolation process for some embodiments of the present invention is illustrated in FIG. 14 through FIG. 17.

The preceding (previous) and subsequent isolation processes referred to herein are arbitrarily named with reference to operations for dividing one lower-electrode metal layer into two low electrodes before/after performing depositing and patterning processes for fabricating the ferroelectric layer and the upper electrode.

Figure 9:
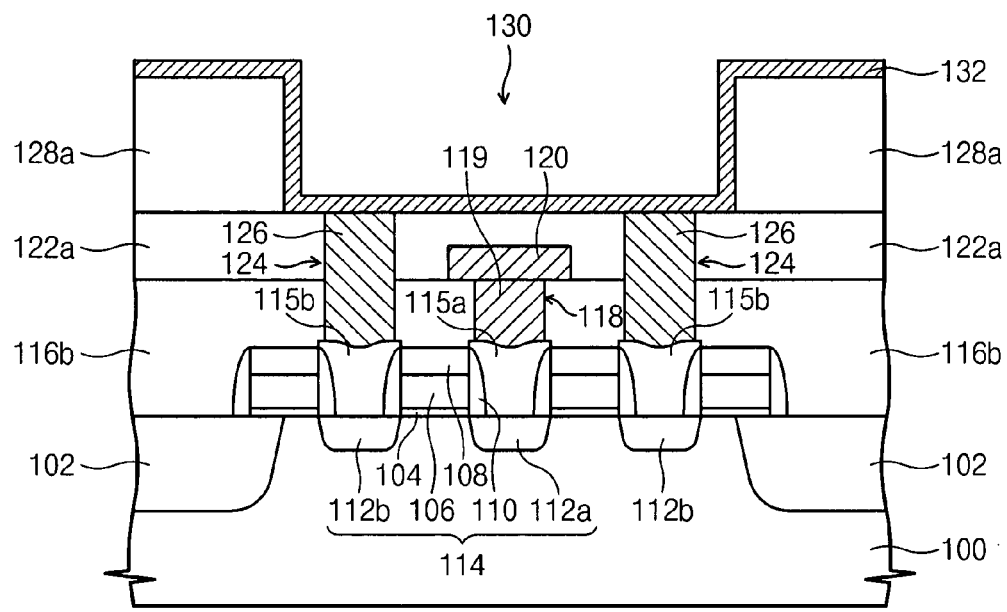
Figure 10:
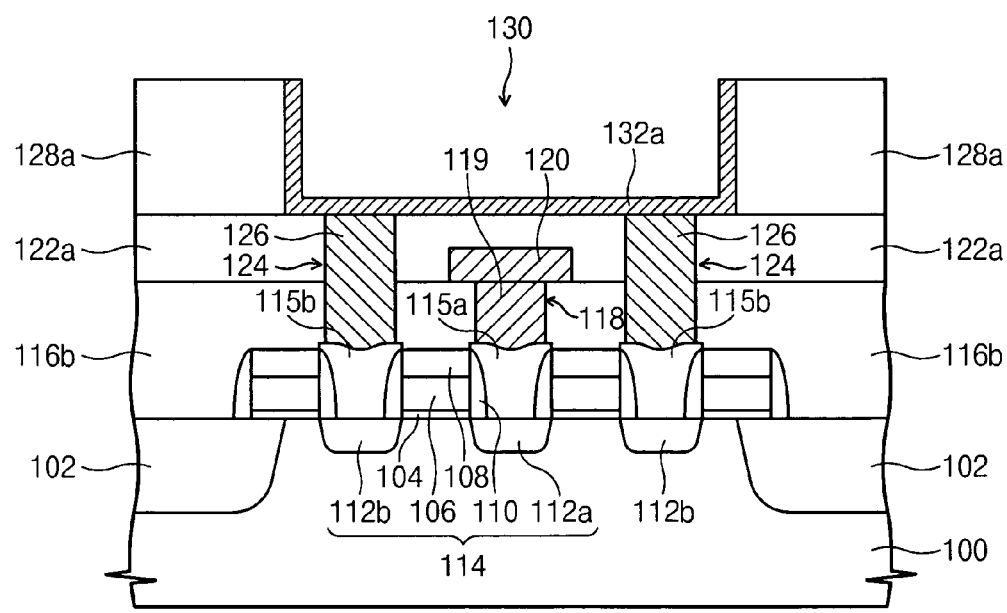

Referring first to the embodiments of FIG. 9 through FIG. 13, a preceding isolation process for fabricating capacitor(s) will now be further described. As shown in FIG. 9, the metal layer 132 is formed, for example, by depositing a noble-metal group material, such as iridium or platinum, in the intaglio pattern 130 and on the upper portion of the oxide layer 128*a*. As shown in FIG. 10, the metal layer 132 formed on the upper portion of the oxide layer 128*a* is selectively removed using, for example, chemical-mechanical polishing (CMP), to leave the metal layer 132*a* in the intaglio pattern 130. As shown in FIG. 10, the metal layer 132*a* is in contact with upper surfaces of at least two buried contacts 126.

Figure 11:
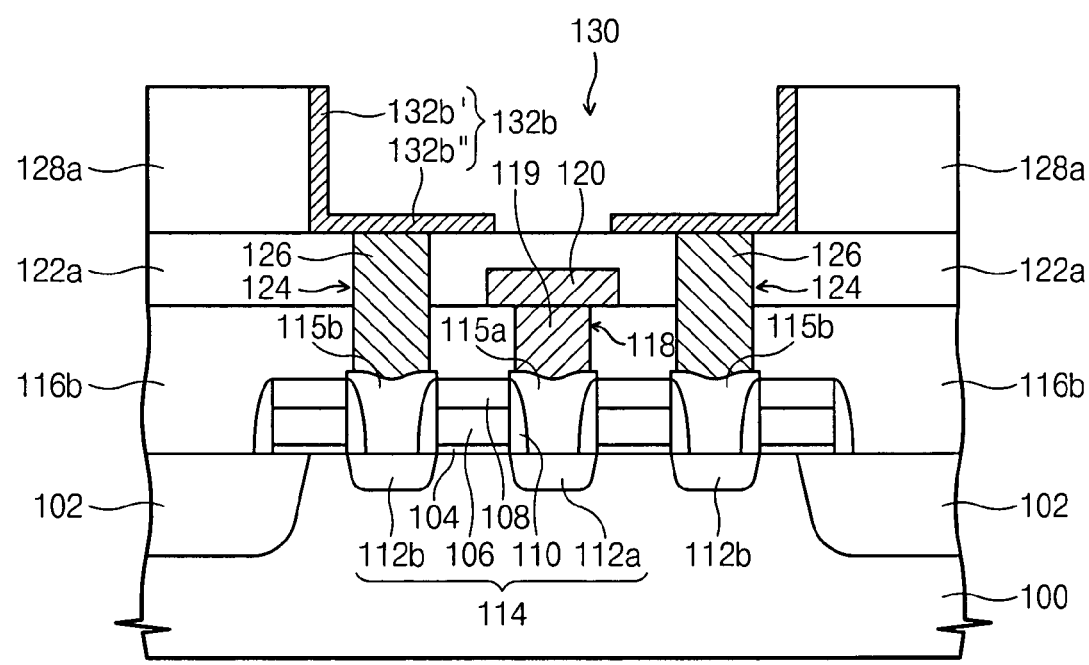

Referring now to FIG. 11, a center portion of the metal layer 132*a* may be continuously removed, for example, by an etching process, to form the at least two lower electrodes 132*b*. The at least two lower electrodes 132*b* are illustrated in contact with respective two buried contacts 126. In other words, the metal layer 132*a* is divided to define lower electrode(s) 132*b* contacting respective buried contact(s) 126, operations with respect to which will generally be described herein with reference to one of the lower electrodes 132*b*. The lower electrode(s) 132*b* may be formed symmetrically in the intaglio pattern 130.

The lower electrode 132*b* illustrated in FIG. 11 includes a horizontal electrode component $132b_1$ and a vertical electrode component $132b_2$. The horizontal electrode component $132b_1$ is shown in contact with upper surfaces of the buried contact 126 and the vertical electrode $132b_2$ is shown as formed on sidewalls of the intaglio pattern 130 in the oxide layer 128*a*. In other words, the oxide layer 128*a* extends from the horizontal electrode component 132*b*, and defines sidewalls of the intaglio pattern 130. As such, shape of the lower electrode 132*b* may be an 'L' shaped configuration and may be a symmetric structure in the intaglio pattern 130 with respective lower electrode(s) 132*b* facing each other.

Figure 13:
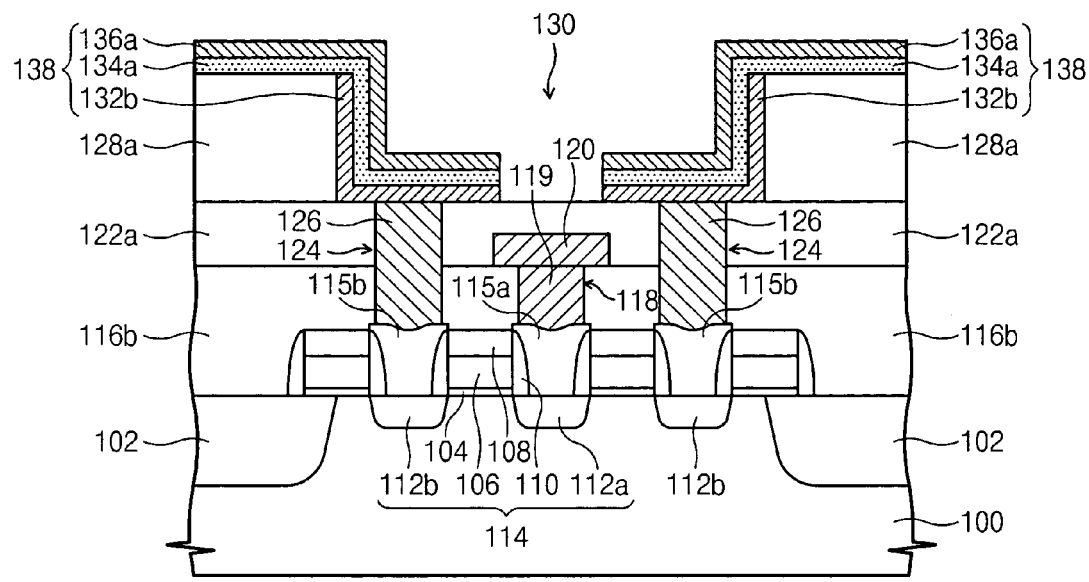

As shown in FIG. 13, the ferroelectric layer 134*a* and the upper electrode 136*a* may then be sequentially formed by depositing and patterning operations on respective upper surface of the lower electrodes 132*b*. As a result, at least two semi-cylindrical capacitors 138 may be are formed symmetrically to each other in the intaglio pattern 130. The ferroelectric layer 134*a* may be formed of ferroelectric materials such as PZT (Lead Zirconium Titrate), SBT (Strontium Barium Tantalum), SBTN (Strontium Barium Tantalum Nitride), SBTT (Strontium Barium Tantalum Titanate) and/or the like. The upper electrode 136*a* may be formed of a noble-metal group material, such as platinum or iridium.

The depositing and patterning processes for fabricating the capacitor 138 may be performed in a low aspect ratio intaglio pattern 130. A low aspect ratio may allow easier formation of the capacitor(s) 138 compared with depositing and patterning processes in a high aspect ratio pattern.

Figure 14:
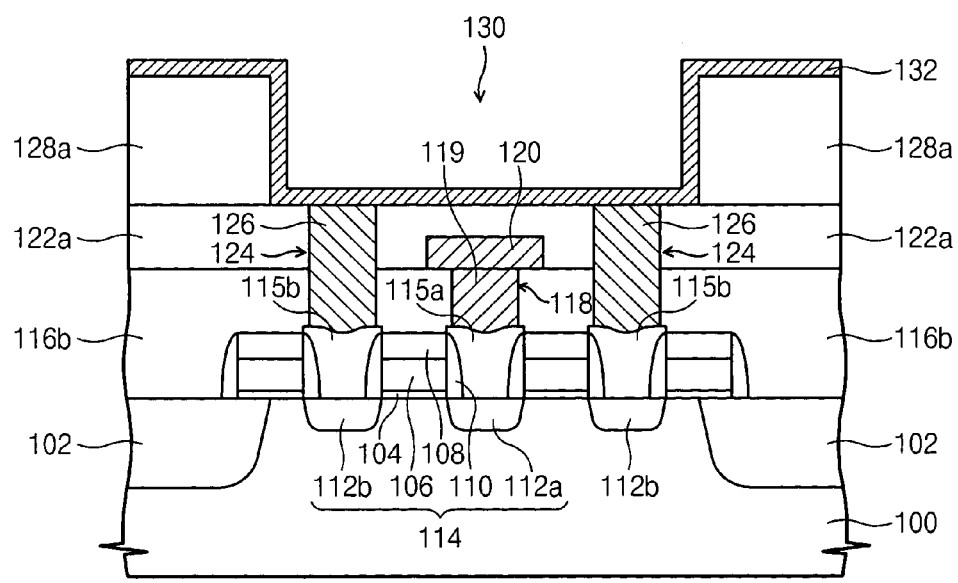
Figure 15:
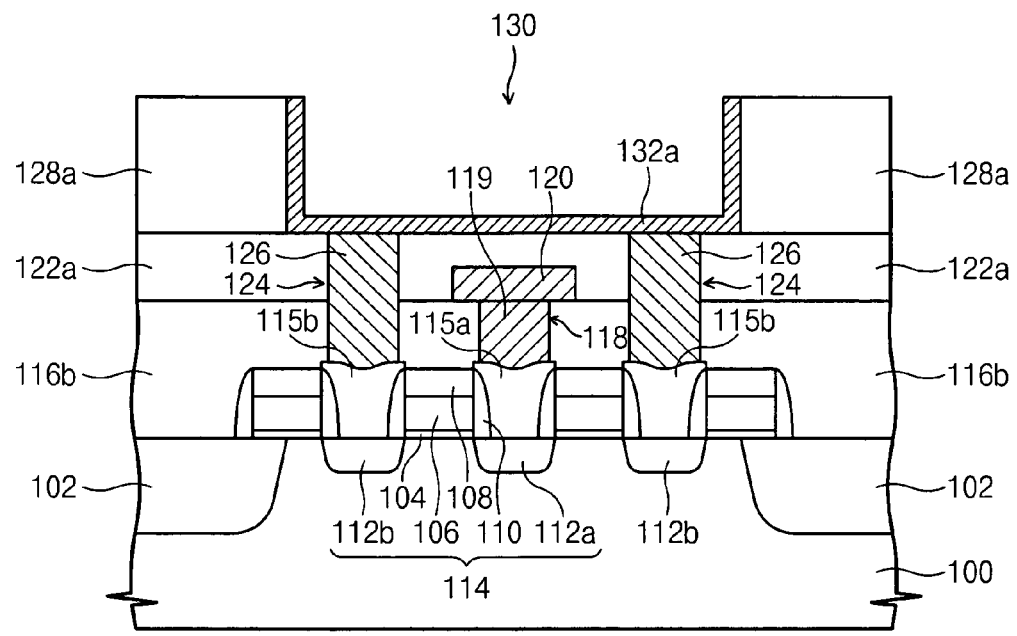

Further embodiments of the present invention will now be described with reference to FIG. 14 through FIG. 17. In subsequent isolation process as shown in FIG. 14, the upper surfaces of the oxide layer 128*a* and inner intaglio pattern 130 may be formed with a noble-metal group material, such as iridium or platinum, to form the metal layer 132. As shown in FIG. 15, the metal layer 132 formed on the upper surfaces of the oxide layer 128*a* may be selectively removed using, for example, a CMP process, leaving the metal layer 132*a* in the intaglio pattern 130. The metal layer 132*a* illustrated in FIG. 15 is in contact with upper surfaces of the buried contacts 126.

Figure 16:
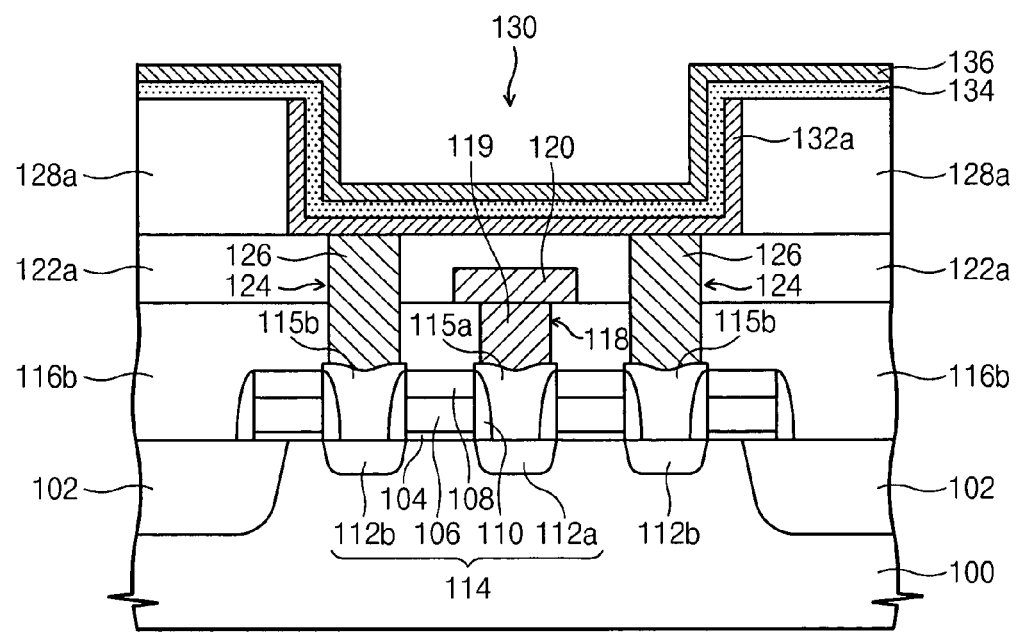

As shown in FIG. 16, the ferroelectric layer 134 and the upper electrode metal layer 136 may be sequentially formed on the upper surfaces of the oxide layer 128*a* and in the intaglio pattern 130 including the metal layer 132*a*. The ferroelectric layer 134a may be a ferroelectric material, such as PZT (Lead Zirconium Titrate), SBT (Strontium Barium Tantalum), SBTN (Strontium Barium Tantalum Nitride), SBTT (Strontium Barium Tantalum Titanate) and/or the like. The upper-electrode metal layer 136 may be formed by depositing a noble metal group material, such as iridium or platinum. Again, the depositing processes may be performed in a low aspect ration intaglio pattern 130, which may simplify the processes relative to a high aspect ratio pattern.

Figure 17:
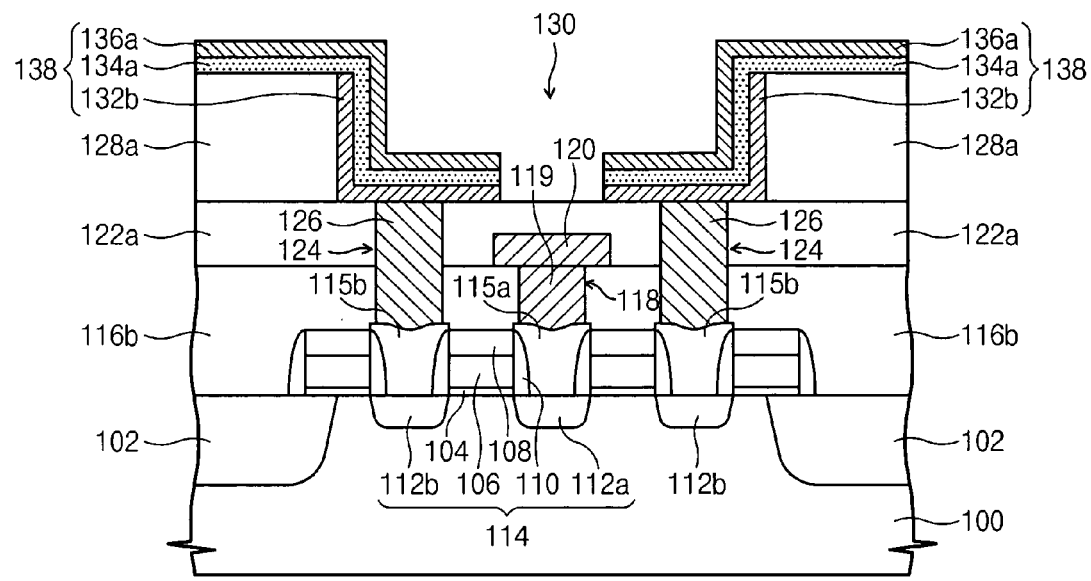

Referring now to the embodiments illustrated in FIG. 17, the upper electrode metal layer 136, the ferroelectric material 134 and the lower electrode metal layer 134 are patterned. As a result, the lower electrode 132b, which is in contact with the upper surfaces of the at least two buried contacts 126, is divided into at least two lower electrodes 132b. Thus, at least two capacitors 138, including the ferroelectric layer 134a and the upper electrode 136a, are formed in the intaglio pattern 130. Thus, a plurality of semi-cylindrical capacitors 138 may be formed symmetrically in the intaglio pattern 130. As shown in the embodiments illustrated in FIG. 12, the isolated lower electrodes 132b may face each other symmetrically in the intaglio pattern 130.

Figure 18:
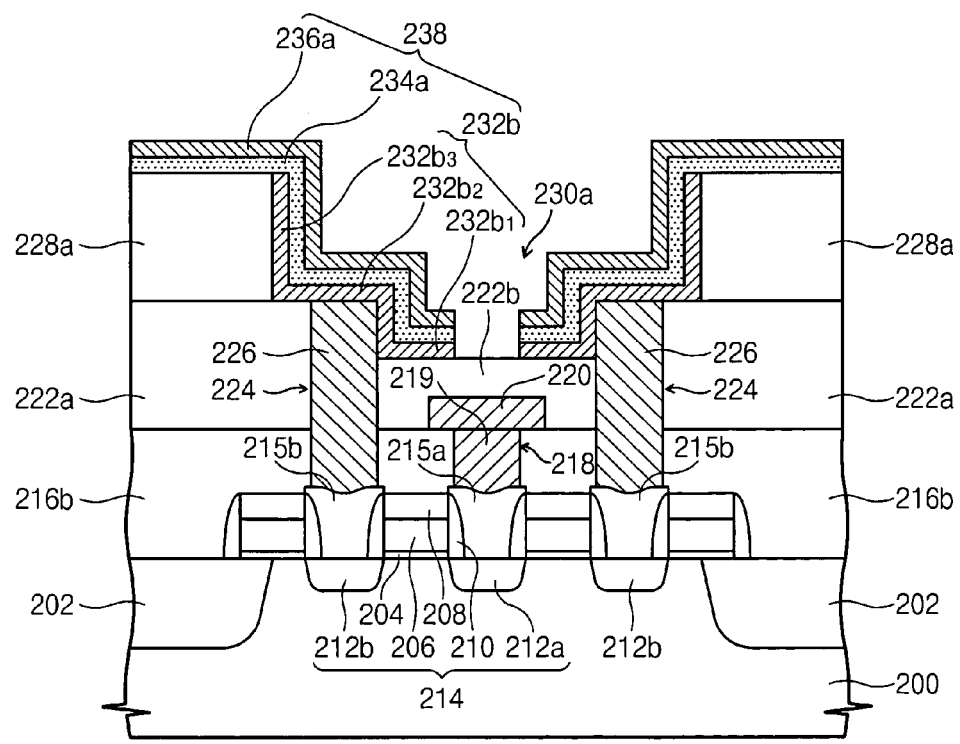
FIG. 18 is a cross-sectional view of a ferroelectric memory device including a semi-cylindrical capacitor according to further embodiments of the present invention.

A ferroelectric memory device including a semi-cylindrical capacitor according to other embodiments of the present invention, as illustrated in FIG. 18, includes: an integrated circuit (semiconductor) substrate 200 including a transistor 214; an interlayer dielectric 216b (hereinafter referred to as "a first interlayer dielectric") formed on the semiconductor substrate 200; a bit line 220 electrically connected to the semiconductor substrate 200; an interlayer dielectric 222a (hereinafter referred to as "a second interlayer dielectric") including a buried contact 226; an oxide layer 228a formed on the second interlayer dielectric 222a; a two-step intaglio pattern 230a exposing upper surfaces and a part of sidewalls of at least two buried contacts 226 formed through the oxide layer 228a; at least two lower electrodes 232b formed in the two-step intaglio pattern 230a symmetrically and in contact with respective upper surfaces and a part of sidewalls of at least two lower electrodes 232b, and; a ferroelectric layer 234a and an upper electrode 236a, which may be sequentially formed on respective upper portions of a plurality of lower electrodes 232b (two shown in FIG. 18 although operations herein will generally be described with reference to one of the lower electrodes 232b to simplify the description).

An active region is defined in the semiconductor substrate 200 by an isolation layer 202 and the transistor 214 is disposed on the active region. The transistor 214 shown in FIG. 18 includes a gate insulation layer 204, a gate electrode 206 and a hard mask 208. The gate insulation layer 204, the gate electrode 206 and the hard mask 208 may be sequentially stacked. A gate spacer 210 may be formed on the both sidewalls of the transistor, 214. The transistor 214 shown in FIG. 18 includes a source region 212a and a drain region 212b. While two drain regions 212b associated with the source region 212a are shown in FIG. 18, the discussion herein will generally refer to a single source and drain region structure of a transistor 214 for purposes of simplifying the discussion. The source region 212a may be formed by implanting a selected ion into the semiconductor substrate 200. In other embodiments, different structures may be provided as the transistor 214.

As shown in the embodiments of FIG. 18, the bit line 220 is electrically connected through a direct contact 219 to the source region 212a. The direct contact 219 is formed in the first interlayer dielectric 216b. The direct contact 219 may be connected to the source 212a through a contact pad 215a formed on the source region 212a.

The lower electrode 232b may be electrically connected to the drain region 212b by a buried contact 226. The buried contact 226 extends through the first interlayer dielectric 216b and the second interlayer dielectric 222a to electrically connect to the drain region 212b. The buried contact 126 may be electrically connected to the drain 112b through the contact pad 115b formed on the drain 112b. For the embodiments of FIG. 18, the surface of the second interlayer dielectric 222b between the two buried contacts 226 illustrate in FIG. 18 is lower than the surface of the second interlayer dielectric 222a formed outside the buried contact 226, which profile is shown in FIG. 18 as provided by forming the second interlayer dielectric as a thinner layer between the buried contacts 226.

The capacitor 238 may include a lower electrode 132b, a ferroelectric layer 234a and an upper electrode 236a, which may be sequentially stacked. The lower electrode 232b and the upper electrode 236a may be a noble-metal group material, such as iridium or platinum. The ferroelectric layer 234a may be a ferroelectric material, such as PZT (Lead Zirconium Titrate), SBT (Strontium Barium Tantalum), SBTN (Strontium Barium Tantalum Nitride), SBTT (Strontium Barium Tantalum Titanate) and/or the like.

Thus, as seen in FIG. 18, the lower electrodes 232b may be formed symmetrically to each other in a two-step intaglio pattern 230. The lower electrode 132b in the illustrated embodiments of FIG. 18 includes a horizontal electrode component $232b_2$, a first vertical electrode $232b_1$ and a second vertical electrode component $232b_3$. The horizontal electrode component $232b_2$ extends from the first vertical electrode $232b_1$ to contact with upper surfaces of the buried contact 226 and the first vertical electrode $232b_1$ is in contact with a part of sidewalls of the buried contact 226. As shown in FIG. 18, the first vertical electrode $232b_1$ includes a horizontal portion extending away from the horizontal electrode component $232b_2$. The second vertical electrode component $232b_3$ extends on sidewalls of the two-step intaglio pattern 230a. In other words, the shape of the lower electrode 232b is a double-refracting shape having at least two bent-up portions. The lower electrodes 232b may face each other symmetrically in the intaglio pattern 230a. In addition, the double-refracting lower electrode 232b may include the second vertical electrode component $232b_2$ formed on sidewalls of the two-step intaglio pattern 230a as well as the first vertical electrode $232b_1$ on a part of sidewalls of the buried contact 226, which may provide an increased surface dimension of electrodes.

The ferroelectric layer 234a and the upper electrode 236a may be stacked on each lower electrode 232b to symmetrically form two or more capacitors 238 (two shown in FIG. 18) in the two-step intaglio pattern 230a. Thus, two or more semi-cylindrical capacitors may be formed symmetrically. The semi-cylindrical shape may increase a surface area of the electrodes for a given area on the substrate 200, as compared to a plane shape electrode. As the capacitance is generally proportional to a surface area defined by dimensions of electrodes, the capacitance of the capacitors may be increased.

The lower electrode 232b, the ferroelectric layer 234a and the upper electrode 236a may be formed in a two-step intaglio pattern 230a having a low aspect ratio. The two-step intaglio pattern 230a may open two or more buried contacts 226 through the oxide layer 228a.

Methods of forming the ferroelectric memory device equipped with the semi-cylindrical capacitor as illustrated in FIG. 18 according embodiments of the present invention will now be further described with reference to FIG. 19 through FIG. 32.

Figure 19:
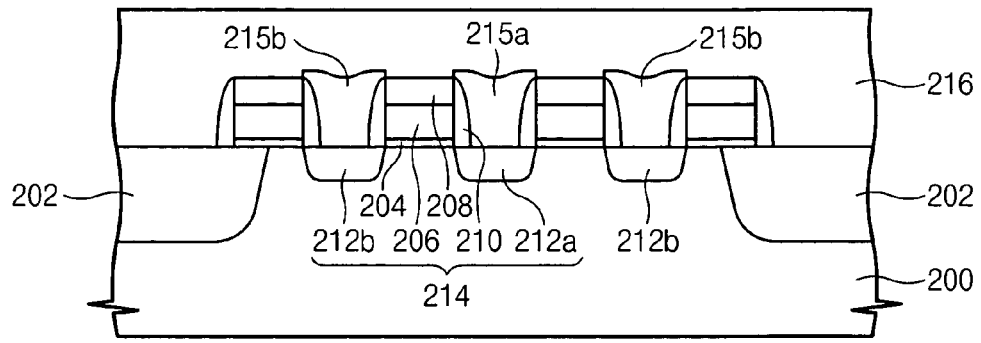
FIG. 19 to FIG. 32 are cross-sectional views illustrating a method of fabricating the ferroelectric memory device of FIG. 18 according to some embodiments of the present invention.

Referring to FIG. 19, an integrated circuit (semiconductor) substrate 200, which may be a semiconductor material, such as silicon, is provided. An active region may be defined in the substrate 200 by forming an isolation layer 202, for example, by a trench formation method. A transistor 214 coupled to being a word line of a memory device may be formed on the active region of the 200 defined by the isolation layer 202. The transistor 214 may be defined by forming the gate insulation layer 204, the gate electrode 206, the hard mask 208 and the gate spacer 210, the source 212a and the drain 212b. The transistor 214 may further include further elements, such as LDD (Lightly Doped Drain) or double gate spacers. The transistor 214 in various embodiments of the present invention may also be formed using a different structure, for example, without forming a hard mask. In other embodiments of the present invention, the contact pads 215a and 215b may also be formed on the substrate 200.

An interlayer dielectric 216 (hereinafter referred to as "a first interlayer dielectric") is formed on the substrate 200 in the area including the transistor 214. The first interlayer dielectric 216 may be formed to a desired thickness by performing, for example, a conventional CVD process. The transistor 214 may, thus, be covered by an insulation material, such as silicon oxide.

Figure 20:
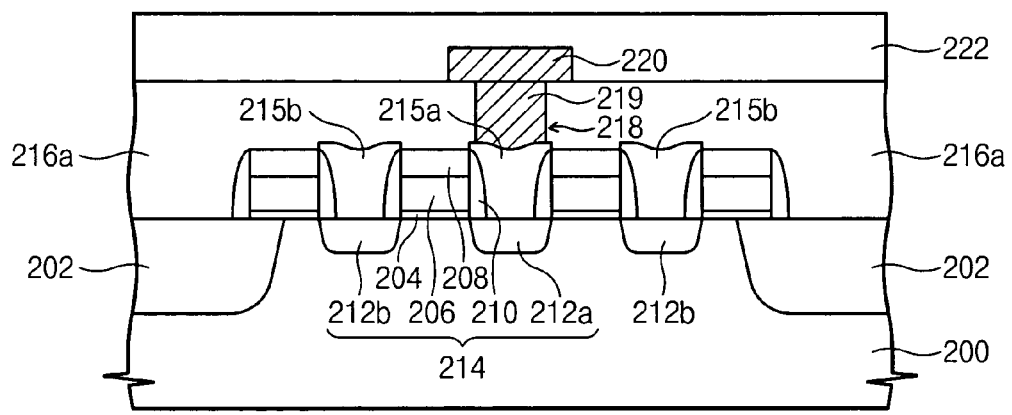

As shown in the embodiments of FIG. 20, a part of the first interlayer dielectric 216 is removed to expose the contact pad 215a formed on the source region 212a, for example, by anisotropic etching. Thus, a first contact hole 218 may be formed in the first interlayer dielectric 216a. The direct contact 219 may be formed by depositing conductive materials in the first contact hole 218.

As also shown in FIG. 20, a bit line 220 may be formed on the first interlayer dielectric 216a. The bit line 220 may be formed in contact with the direct contact 219 by, for example, depositing and patterning a conductive material. The bit line 220 may function, for example, as a data line of the ferroelectric memory device.

Another interlayer dielectric 222 (hereinafter referred to as "a second interlayer dielectric") may be formed on the first interlayer dielectric 216a in an area/region including the bit line 220. As with the first interlayer dielectric 216, the second interlayer dielectric 222 may be formed to a desired thickness by, for example, a conventional CVD process. As such, the bit line 220 may be covered with silicon oxide or the like.

Figure 21:
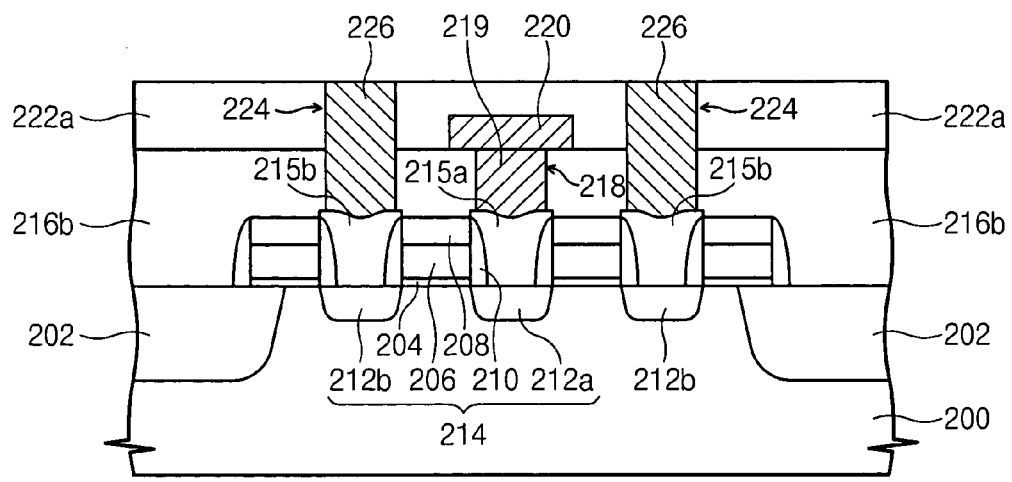

Referring now to FIG. 21, the first interlayer dielectric 216a (designated 216b in FIG. 21) and the second interlayer dielectric 222 (designated 222a in FIG. 21) may be selectively removed to expose the contact pad 215b formed on the drain region 212b, for example, by an anisotropic etching process, such as plasma drying. Thus, the second contact hole 224 may be formed in the first interlayer dielectric 216b and the second interlayer dielectric 222a. The second contact hole 224 may be filled with metal conductive materials, such as poly silicon or tungsten, to form a buried contact 226. The buried contact 226 may be electrically connected to the drain 212b via the contact pad 215b interposed therebetween.

Figure 22:
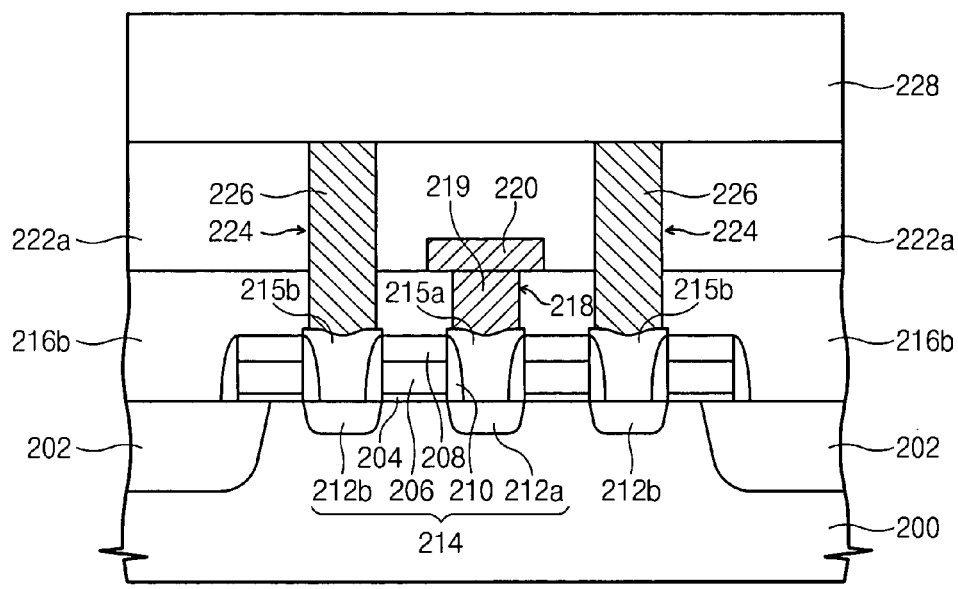

As shown in FIG. 22, an oxide layer 228 may be formed on the second interlayer dielectric 222a in a region including the buried contact 226. For example, the oxide layer 228 may be formed by depositing an oxidation material, such as silicon dioxide or the like, by, for example, a conventional CVD process.

Figure 23:
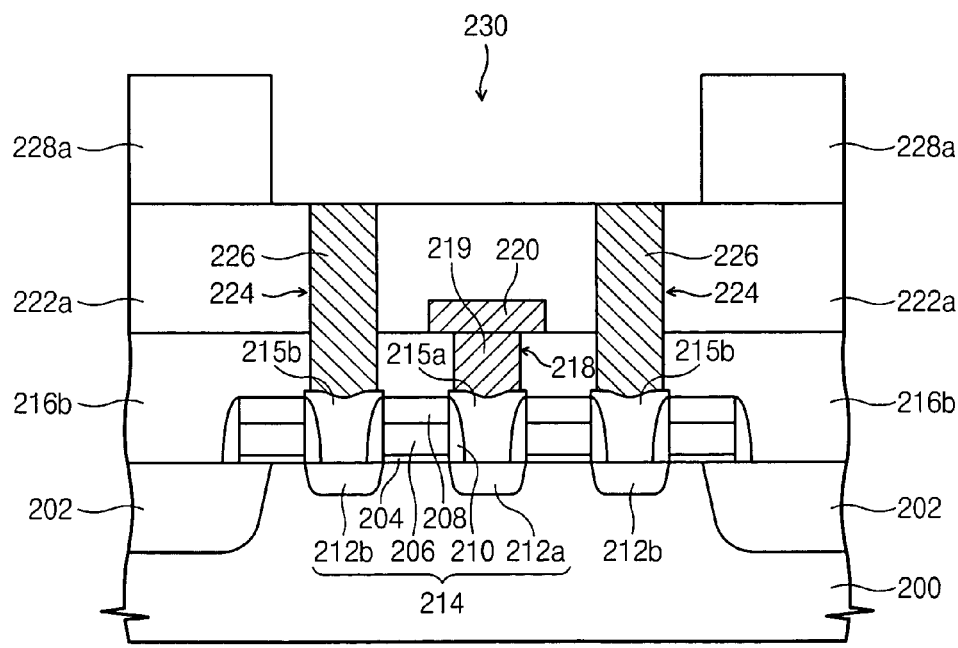

Referring to FIG. 23, a part of the oxide layer 228 (shown as 228a in FIG. 23) may be etched to expose the upper portion of the at least two buried contacts 226 and a part of the upper surfaces of the second interlayer dielectric 222a. Thus, the intaglio pattern 230, which exposes the upper portion of the at least two buried contacts 226, may be formed. As shown in the embodiments of FIG. 23, a bottom of the intaglio pattern 230 is defined by exposed upper surfaces of the interlayer dielectric 222a and upper portions of the at least two buried contacts 226 (two shown in FIG. 23). Sidewalls of the intaglio pattern 230 are defined by etched sidewalls of the oxide layer 228a. The intaglio pattern 230 may have a flat disc shape and may have a low aspect ratio.

Figure 24:
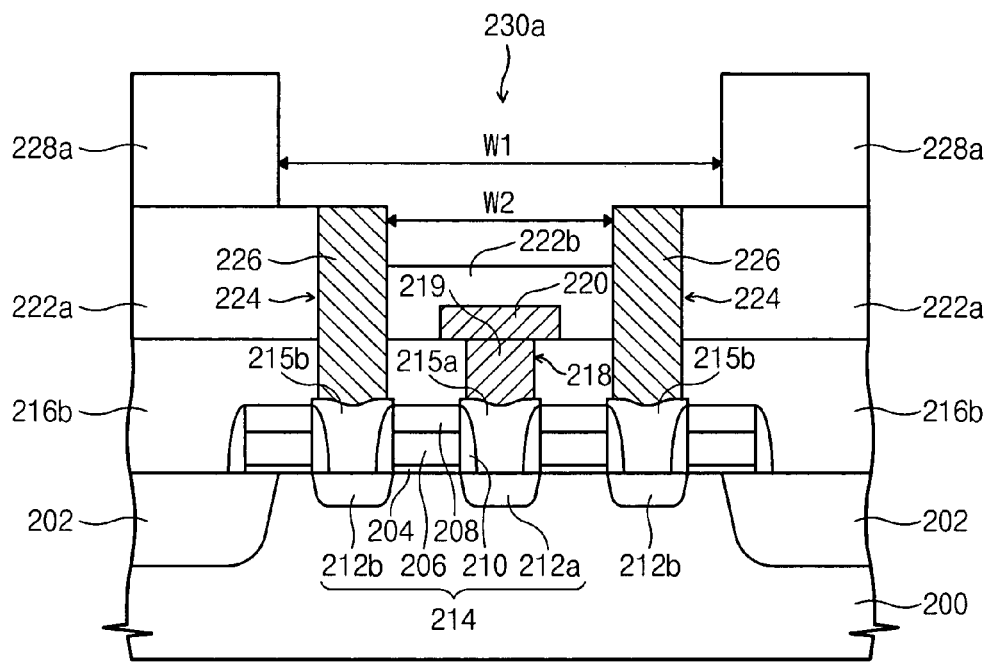
Figure 25:
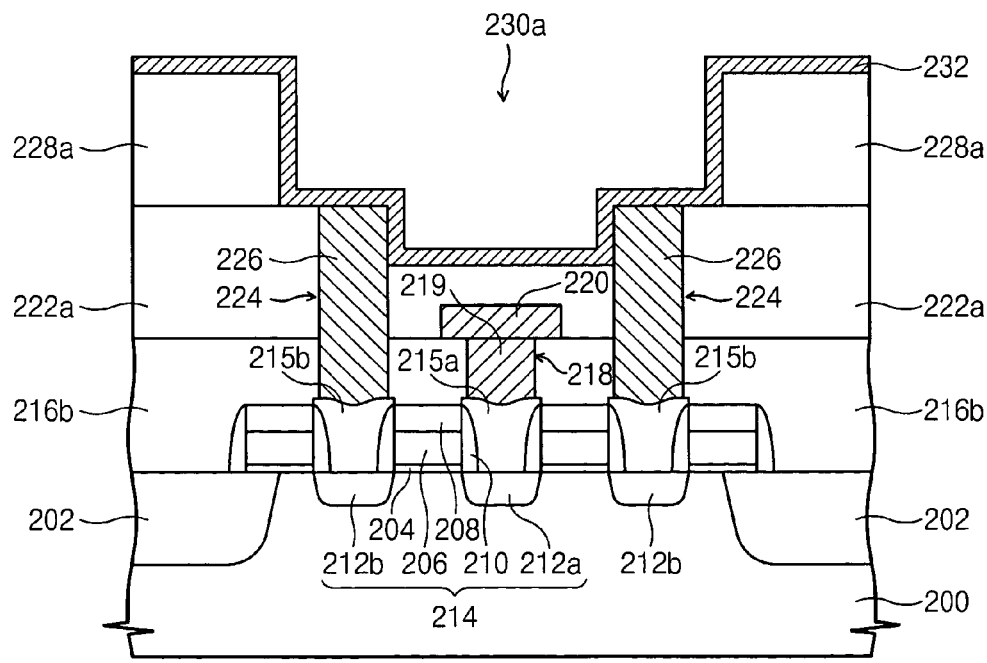

Referring now to FIG. 24, a part of the exposed upper surfaces of the interlayer dielectric 222a may be further etched to open a part of sidewalls of the buried contacts 226. In other words, a surface of the second interlayer dielectric 222b between the buried contacts 226 is lower than a surface of the second interlayer dielectric 222a outside the buried contacts 226. Thus, a two-step intaglio pattern 230a may be formed as illustrated in FIG. 25. In the embodiments of FIG. 24, a first width ($W_1$) of the intaglio pattern 230a between the sidewalls of the oxide layers 228a is wider than a second width ($W_2$) between the exposed buried contacts 226.

Formation of two or more capacitors (see 238 in FIG. 28 or 238 in FIG. 32) in contact with respective ones of corresponding exposed buried contacts 226 in the two-step intaglio pattern 230a will now be described. Two alternate approaches to forming the capacitors, a preceding or previous and a subsequent isolation process will be described. Embodiments of the preceding isolation process are illustrated in FIG. 25 through FIG. 28. Embodiments of the subsequent isolation process are illustrated in FIG. 29 through FIG. 32. As with the description of other embodiments above, the reference to preceding or previous and subsequent isolation processes is for reference purposes only based on the performance of the process for dividing one lower electrode metal layer into two (or more) lower electrodes, which occurs, respectively, before (previous/preceding) or after (subsequent) depositing and patterning processes for fabricating the ferroelectric layer and the upper electrode.

Figure 26:
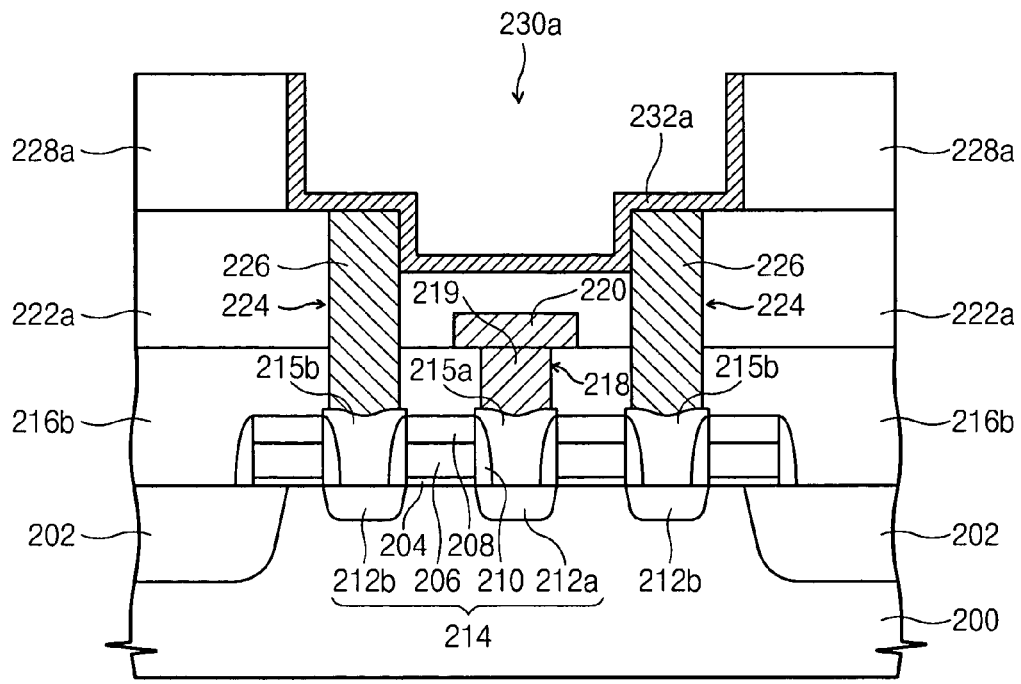
Figure 27:
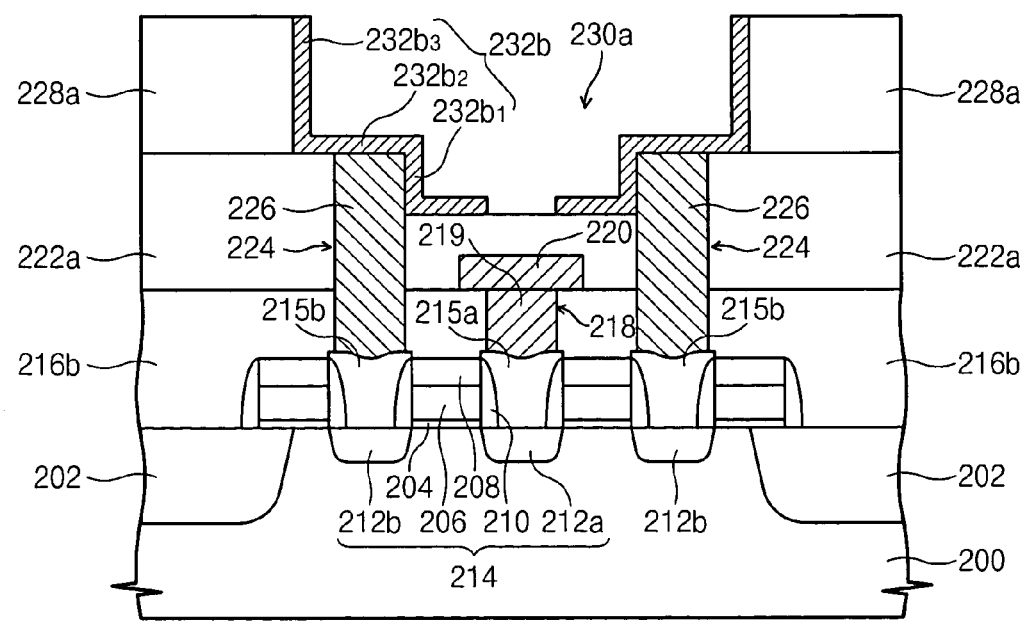

Referring now to the preceding or previous process embodiments of FIG. 25 to FIG. 28, as shown in FIG. 25, the metal layer 232 may be formed by depositing a noble-metal group material, such as iridium or platinum, in the two-step intaglio pattern 230 and on the upper surfaces of the oxide layer 228a. As shown in FIG. 26, the metal layer 232 on the upper surfaces of the oxide layer 228a may be removed, for example, using CMP. As a result, the lower-electrode metal layer 232a may remain only in the two-step intaglio pattern 230a. The metal layer 232a shown in FIG. 26 remains in contact with upper surfaces and sidewalls of the buried contacts 226.

As shown in FIG. 26, a center portion of the metal layer 232a (FIG. 26) is removed, for example, by an etching process, to form two or more lower electrodes (two shown in FIG. 27) in contact with respective buried contacts 226. The lower electrodes 232b may be formed in a (relative to each other) symmetric structure in the two-step intaglio pattern 230a. For the embodiments shown in FIG. 27, the lower electrode 132b includes a horizontal electrode component $232b_2$, a first vertical electrode $232b_1$ and a second vertical electrode component 232b₃. The horizontal electrode component 232b₂ may extend from the first vertical electrode 232b₁ along and in contact with the upper surfaces of the buried contact 226 and the first vertical electrode 232b₁ may be in contact with a part of sidewalls of the buried contact 226. The second vertical electrode component 232b₃ extends along a sidewall of the two-step intaglio pattern 230a. In other words, the lower electrode 232b may have a double-refracting shape having at least two bent-up portions. Ones of the lower electrodes 232b may face each other symmetrically in the intaglio pattern 230a.

Double-refracting lower electrodes 232b including the second vertical electrode component 232b₂ formed on sidewalls of the two-step intaglio pattern 230a as well as the first vertical electrode 232b₁ on a part of sidewalls of the buried contact 226 may provide increased surface dimensions of the electrodes relative to a plane shape electrode for a given area of the substrate 200.

Figure 28:
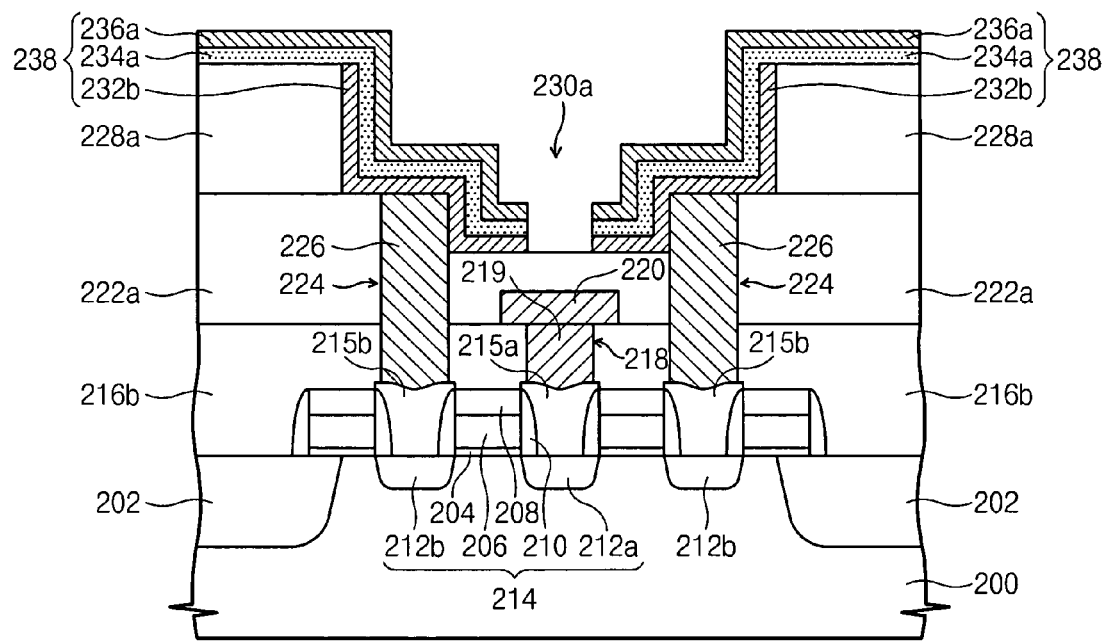

As shown in FIG. 28, the ferroelectric layer 234a and the upper electrode 236a may be sequentially formed, for example, by depositing and patterning processes on the upper surfaces of the already (previously/preceding) isolated two or more lower electrodes 232b. As a result, two or more semi-cylindrical capacitors 238 may be formed symmetrically in the two-step intaglio pattern 230a. The ferroelectric layer 234a may be a ferroelectric material, such as PZT (Lead Zirconium Titrate), SBT (Strontium Barium Tantalum), SBTN (Strontium Barium Tantalum Nitride), SBTT (Strontium Barium Tantalum Titanate) and/or the like. The upper electrode 136a may be formed of a noble metal material, such as Platinum or Iridium.

In some embodiments of the present invention, depositing and patterning process for fabricating capacitors 238 may be performed in a two-step intaglio pattern 230a having a low aspect ratio. As a result, it may be easier to form the capacitor 238 as compared with doing so in a high aspect ratio pattern.

Figure 29:
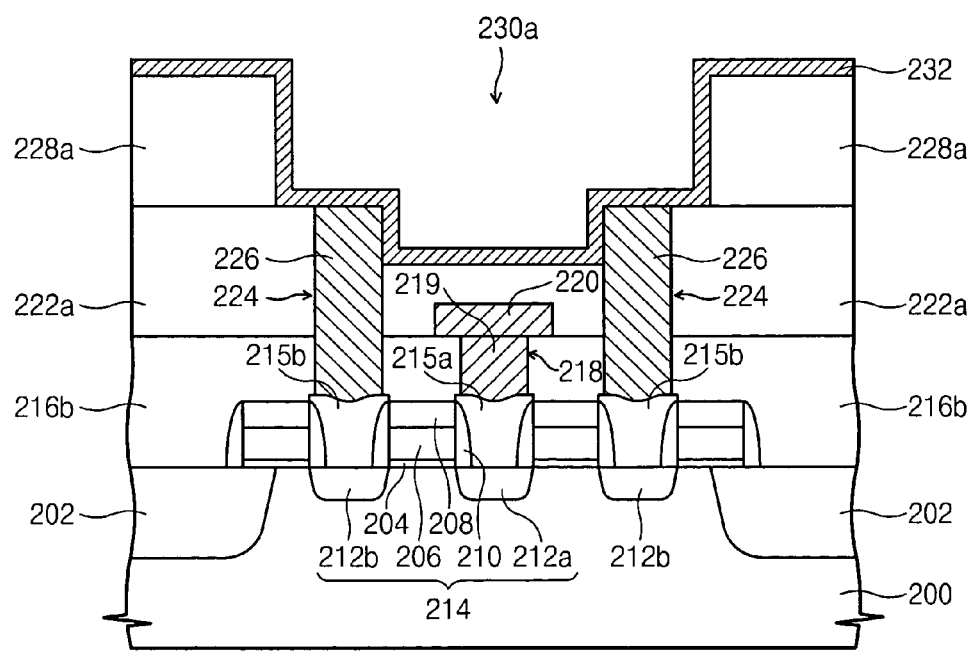
Figure 30:
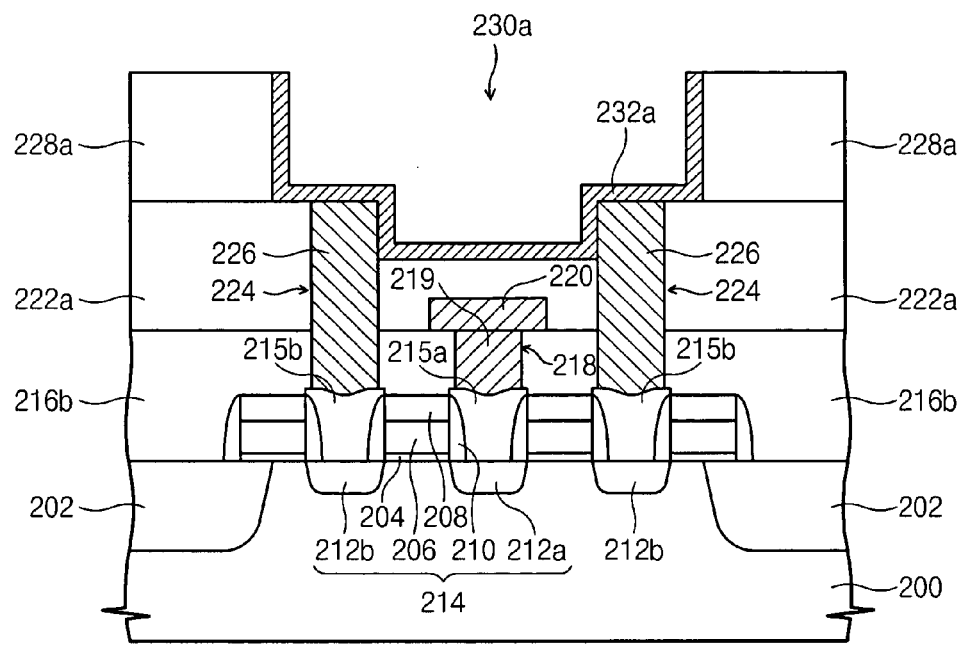

An alternative (subsequent) process will now be described with reference to FIG. 29 through FIG. 32. As shown in FIG. 29, the metal layer 232 may be formed by depositing a noble-metal group material, such as iridium or platinum, in the two-step intaglio pattern 230a and on upper surfaces of the oxide layer 228a. As shown in FIG. 30, the metal layer 232 on the upper surfaces of the oxide layer 228a may be removed, for example, using CMP. The lower-electrode metal layer 232a remains in the two-step intaglio pattern 230a and in contact with upper surfaces of the buried contacts 126.

Figure 31:
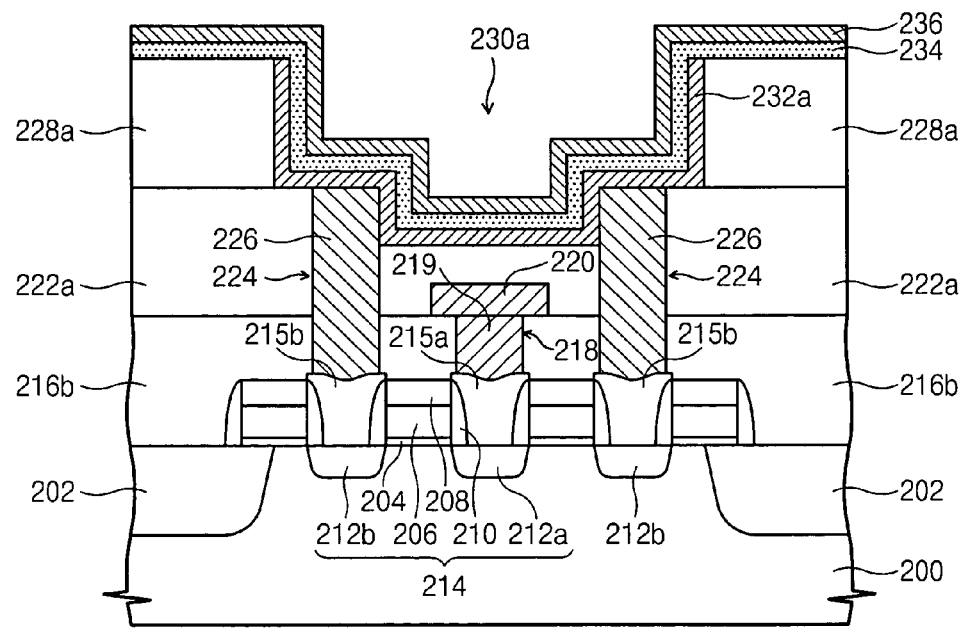

As shown in FIG. 31, the ferroelectric layer 234 and the upper electrode metal layer 236 may be sequentially formed on the upper surfaces of the oxide layer 228a and in the two-step intaglio pattern 230a on the metal layer 232a. The ferroelectric layer 234a may be a ferroelectric material, such as PZT (Lead Zirconium Titrate), SBT (Strontium Barium Tantalum), SBTN (Strontium Barium Tantalum Nitride), SBTT (Strontium Barium Tantalum Titanate) and/or the like. The upper electrode metal layer 236 may be formed by depositing a noble-metal group material, such as iridium or platinum. These depositing and patterning processes may be performed in a low aspect ratio mulit-step intaglio pattern 230a so that they may be performed more easily than with a high aspect ratio pattern.

Figure 12:
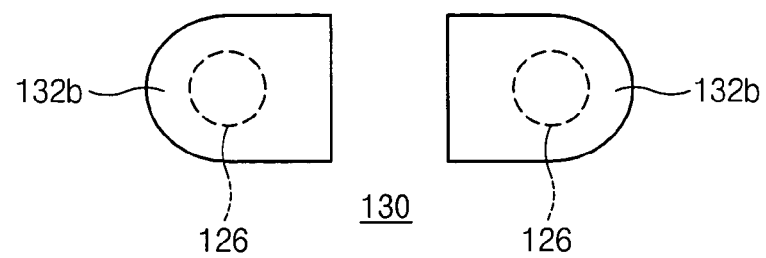
Figure 32:
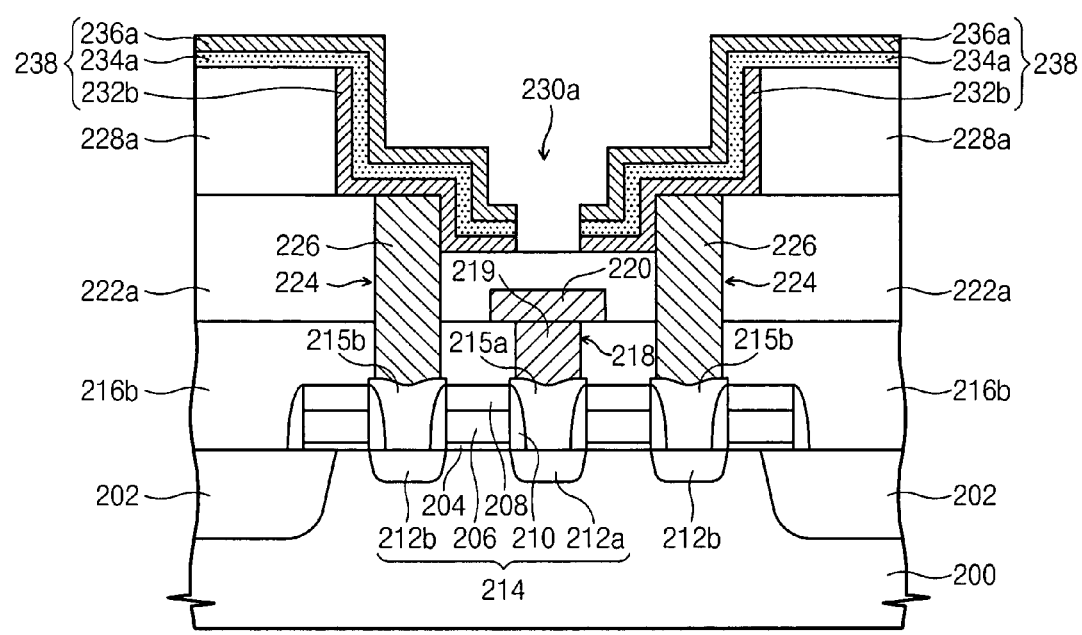

As shown in FIG. 32, the upper electrode metal layer 236, the ferroelectric material 234 and the lower electrode metal layer 234 may then be patterned to form two or more lower electrodes 232b, which are in contact with the upper surfaces of corresponding buried contacts 226. In other words, a subsequent isolation process may be used to form the capacitors 238. Thus, two or more capacitors 238 including the ferroelectric layer 234a and the upper electrode 236a may be formed in two-step intaglio pattern 230a. The capacitors may be semi-cylindrical capacitors 238 formed symmetrically in the two-step intaglio pattern 230a. For example, as shown in FIG. 12, the lower electrodes 132b (and the formed capacitors 238) may face each other symmetrically in the intaglio pattern 230a (FIG. 32). Again, the patterning process for fabricating the capacitors 238 may be performed in a low aspect ratio two-step intaglio pattern 230a, which may simplify the patterning processes compared to a high aspect ratio pattern.

Some embodiments of the present invention may provide increased capacitance by increasing the surface dimensions of electrodes, more particularly, by forming capacitors with three dimensional structures as compared with a conventional plane (two dimensional) capacitor. Such capacitors, in some embodiments of the present invention, formed in a low aspect ratio intaglio pattern and are formed with a symmetrical semi-cylindrical shape. A ferroelectric capacitor equipped with such a semi-cylindrical capacitor may have increased surface dimensions of electrodes while still meeting thin film limitations and etching margin requirements.

The present invention has been described above in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An integrated circuit device comprising:
   an integrated circuit substrate;
   an interlayer dielectric on the integrated circuit substrate and having a plurality of buried contacts therein;
   an oxide layer on the interlayer dielectric and having an intaglio pattern over the buried contacts;
   a plurality of lower electrodes within a single opening in the intaglio pattern, the lower electrodes electrically contacting corresponding ones of the buried contacts; and
   upper electrodes over corresponding lower electrodes interposing a ferroelectric layer therebetween, wherein the lower electrode, the ferroelectric layer and the upper electrode form a ferroelectric memory device;
   wherein at least one of the lower electrodes comprises:
   a horizontal electrode component contacting an upper surface of its corresponding buried contact; and
   a vertical electrode component extending from the horizontal electrode component on a sidewall of the intaglio pattern.

2. The integrated circuit device of claim 1 wherein the lower electrodes comprise semi-cylindrical lower electrodes symmetrically arranged in the intaglio pattern.

3. The integrated circuit device of claim 1 further comprising a plurality of transistors in the integrated circuit substrate and wherein the buried contacts electrically contact corresponding ones of the transistors.

4. An integrated circuit device comprising:
   an integrated circuit substrate;
   an interlayer dielectric on the integrated circuit substrate and having a plurality of buried contacts therein;
   an oxide layer on the interlayer dielectric and having an intaglio pattern over the buried contacts;

a plurality of lower electrodes within a single opening in the intaglio pattern, the lower electrodes electrically contacting corresponding ones of the buried contacts; and upper electrodes over corresponding lower electrodes interposing a ferroelectric layer therebetween, wherein the lower electrode, the ferroelectric layer and the upper electrode form a ferroelectric memory device;

wherein the intaglio pattern comprises a multi-step intaglio pattern extending along upper surfaces of the buried contacts and a part of sidewalls of the buried contacts.

5. The integrated circuit device of claim 4 wherein at least one of the lower electrodes comprises:

a first vertical electrode component extending along the part of the sidewall of its corresponding buried contact;

a horizontal electrode component extending from the first vertical electrode component along the upper surface of its corresponding buried contact; and a second vertical electrode component extending from the horizontal electrode component along a sidewall of the multi-step intaglio pattern in the oxide layer.

6. The integrated circuit device of claim 5 wherein the at least one of the lower electrodes further comprises a second horizontal electrode component extending inwardly from the first vertical electrode along a surface of the interlayer dielectric lower than a surface of the interlayer dielectric beyond the buried contacts.

7. The integrated circuit device of claim 4 wherein the capacitors comprise semi-cylindrical capacitors symmetrically arranged in the intaglio pattern.

8. A ferroelectric memory device including semi-cylindrical capacitors, comprising:

an interlayer dielectric including at least two buried contacts;

an oxide layer formed on the interlayer dielectric;

a two-step intaglio pattern in the oxide layer and exposing upper surfaces and a part of sidewalls of the at least two buried contacts;

at least two lower electrodes formed in the two-step intaglio pattern, each of the at least two lower electrodes being in contact with a corresponding one of the at least two buried contacts; and a ferroelectric layer and an upper electrode sequentially formed on the lower electrodes.

9. The memory device of claim 8 wherein a single opening in the intaglio pattern exposes the upper surfaces and the part of the sidewalls of the at least two buried contacts and wherein the at least two lower electrodes are formed in the single opening in the two-step intaglio pattern.

10. The memory device of claim 9 wherein at least one of the lower electrodes comprises:

a first vertical electrode component extending along the part of the sidewall of its corresponding buried contact;

a substantially planar horizontal electrode component extending directly from the first vertical electrode component along the upper surface of its corresponding buried contact; and a second vertical electrode component extending directly from the horizontal electrode component along a sidewall of the multi-step intaglio pattern in the oxide layer.

11. The memory device of claim 9 wherein the upper surfaces of the at least two buried contacts are exposed by a first step of the intaglio pattern and the part of the sidewalls of the at least two buried contacts are exposed by a second step of the intaglio pattern extending between the at least two buried contacts.

* * * * *